US012132129B2

(12) United States Patent
Muzzillo et al.

(10) Patent No.: US 12,132,129 B2
(45) Date of Patent: Oct. 29, 2024

(54) HIGH-PERFORMANCE METAL GRIDS FOR SOLAR CELLS FORMED BY CRACKED FILM LITHOGRAPHY

(71) Applicant: Alliance for Sustainable Energy, LLC, Golden, CO (US)

(72) Inventors: Christopher Paul Muzzillo, Evergreen, CO (US); Matthew Owen Reese, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/759,840

(22) PCT Filed: Feb. 15, 2021

(86) PCT No.: PCT/US2021/018129
§ 371 (c)(1),
(2) Date: Jul. 29, 2022

(87) PCT Pub. No.: WO2021/163670
PCT Pub. Date: Aug. 19, 2021

(65) Prior Publication Data
US 2023/0073735 A1 Mar. 9, 2023

Related U.S. Application Data

(60) Provisional application No. 62/976,840, filed on Feb. 14, 2020.

(51) Int. Cl.
*H01L 31/0463* (2014.01)
*G03F 7/004* (2006.01)
*H01L 31/18* (2006.01)

(52) U.S. Cl.
CPC ........ *H01L 31/0463* (2014.12); *G03F 7/0043* (2013.01); *H01L 31/1828* (2013.01); *H01L 31/1884* (2013.01)

(58) Field of Classification Search
None
See application file for complete search history.

(56) References Cited

U.S. PATENT DOCUMENTS

| | | | |
|---|---|---|---|
| 9,708,712 B2 | 7/2017 | Carnahan et al. | |
| 2007/0186970 A1* | 8/2007 | Takahashi | H01L 31/1804 136/255 |
| 2016/0009928 A1* | 1/2016 | Kulkarni | H10K 71/60 106/287.18 |
| 2016/0087137 A1* | 3/2016 | Shibasaki | H01L 31/0687 136/249 |

(Continued)

FOREIGN PATENT DOCUMENTS

WO 2018229561 A1 12/2018

OTHER PUBLICATIONS

Rao, et al., Adv. Mater. Interfaces 2014, 1400090 (Year: 2014).*

(Continued)

*Primary Examiner* — Sadie White
(74) *Attorney, Agent, or Firm* — Michael A. McIntyre; Sam J. Barkley

(57) ABSTRACT

Disclosed herein are methods for using cracked film lithography (CFL) for patterning transparent conductive metal grids. CFL can be vacuum- and Ag-free, and it forms more durable grids than nanowire approaches.

8 Claims, 47 Drawing Sheets

(56) References Cited

U.S. PATENT DOCUMENTS

2017/0261858 A1  9/2017  Naughton et al.

OTHER PUBLICATIONS

Kiruthika (Year: 2014).*
Xu (Year: 2018).*
Gupta, N. et al., "Highly Conformal Ni Micromesh as a Current Collecting Front Electrode for Reduced Cost Si Solar Cell," Applied Materials and Interfaces, vol. 9, 2017, 7 pages.
Muzzillo, C.P., "Metal Nano-Grids for Transparent Conduction in Solar Cells," Solar Energy Materials and Solar Cells, vol. 169, 2017, PCT Examiner retrieved from the internet May 30, 2021; 41 pages.
Muzzillo, C.P. et al., "Potential-Induced Degradation of Cu(In,Ga)Se2 Solar Cells: Alkali Metal Drift and Diffusion Effects," IEEE Journal of Photovoltaics, vol. 8, No. 5, Sep. 2018, 6 pages.
Muzzillo, C.P. et al., "Fundamentals of Using Cracked Film Lithography to Pattern Transparent Conductive Metal Grids for Photovoltaics," Langmuir, vol. 36, No. 17, 2020, 6 pages.
Oh, S. et al., "Control of Crack Formation for the Fabrication of Crack-Free and Self-Isolated High-Efficiency Gallium Arsenide Photovoltaic Cells on Silicon Substrate," IEEE Journal of Photovoltaics, vol. 6, No. 4, Jul. 2016, 5 pages.
PCT/US21/18129 Written Opinion and Search Report dated Aug. 5, 2021; 10 pages total.

* cited by examiner

HIGH-PERFORMANCE METAL GRIDS FOR SOLAR CELLS FORMED BY CRACKED FILM LITHOGRAPHY

CROSS-REFERENCE TO RELATED APPLICATIONS

This application is a national phase entry under 35 U.S.C. § 371 and claims priority to PCT application number PCT/US2021/018129 filed 15 Feb. 2021 which claims priority under 35 U.S.C. § 119 to U.S. provisional patent application No. 62/976,840 filed on 14 Feb. 2020, the contents of which are hereby incorporated in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

The transparent conduction performance of metal grids has a unique advantage over transparent conductive oxides (TCOs). Their thicknesses can be increased until grid resistance becomes negligible, without any penalty in transmittance. Theoretical investigations have further shown that all photovoltaic (PV) absorber technologies can benefit from improving metal grids. In spite of this promise, to date there is no scalable process for fabricating high-performance grids, outside of the high-temperature fired metal inks used in most Si modules.

SUMMARY

In an aspect, disclosed herein is a method for using cracked film lithography to fabricate metal grids. In an embodiment, the method results in metal grids are transparent contacts. In an embodiment, the transparent contacts are part of a photovoltaic cell. In another embodiment, the photovoltaic cell is a solar cell.

In an aspect, disclosed herein is an optoelectronic device comprising a photovoltaic cell. In an embodiment, the optoelectronic device included cracked film lithography grids. In another embodiment, the optoelectronic device has narrow cells having a width of from about 0.5 to about 2 cm. In an embodiment, the optoelectronic device has a semiconductor sheet resistance of greater than 100 Ω/sq. In an embodiment, the optoelectronic device has monolithically-integrated thin-film photovoltaic modules. In an embodiment, the optoelectronic device contains transparent contacts. In another embodiment, the optoelectronic device contains metal grids.

Other objects, advantages, and novel features of the present invention will become apparent from the following detailed description of the invention when considered in conjunction with the accompanying drawings.

BRIEF DESCRIPTION OF THE DRAWINGS

FIG. 16 depicts total power loss density optimized with respect to grid transmittance and shown as a function of solar cell length for the screen-printed grating baseline (black diamonds), PS-(blue circles), PMMA-(green triangles) and $TiO_2$-patterned CFL grids (red squares) at a semiconductor sheet resistance of 10 Ω/sq.

FIG. 28 depicts module efficiency as a function of monolith width for the grid-free (black), screen-printing (gray), uniform CFL (green) and patterned CFL (orange) grid cases at a grid T of 0.95 and TCO sheet resistances of 10 Ω/sq.

FIG. 34 depicts optical micrographs of samples characterized in Table 3 and also depicts properties of grids that were electroplated through crack templates after pre-baking at different temperatures.

FIG. 36 depicts optical micrographs showing how softening polymer crack templates improves adhesion to prevent electroplating between the crack template and substrate: crack templates pre-baked at (FIG. 36a) 100° C.

FIG. 38a standard case and FIG. 38b incorporated CFL grids.

FIG. 39a standard case and FIG. 39b incorporated electroplated CFL grids.

FIG. 40a standard case, FIG. 40b incorporated CFL grids using metal sputtering or evaporation, and FIG. 40c incorporated CFL grids using electroplated metal.

(FIG. 41a) after deposition of the PMMA crack template, (FIG. 41b) after a 5 min pre-bake in air at 120° C., (FIG. 41c) after oxide etching, Ni electroless and Au electroplating, and (FIG. 41d) after lift-off by ultrasonication in tetrahydrofuran.

DETAILED DESCRIPTION

Figures 1A, 1B, 1C, 1D:
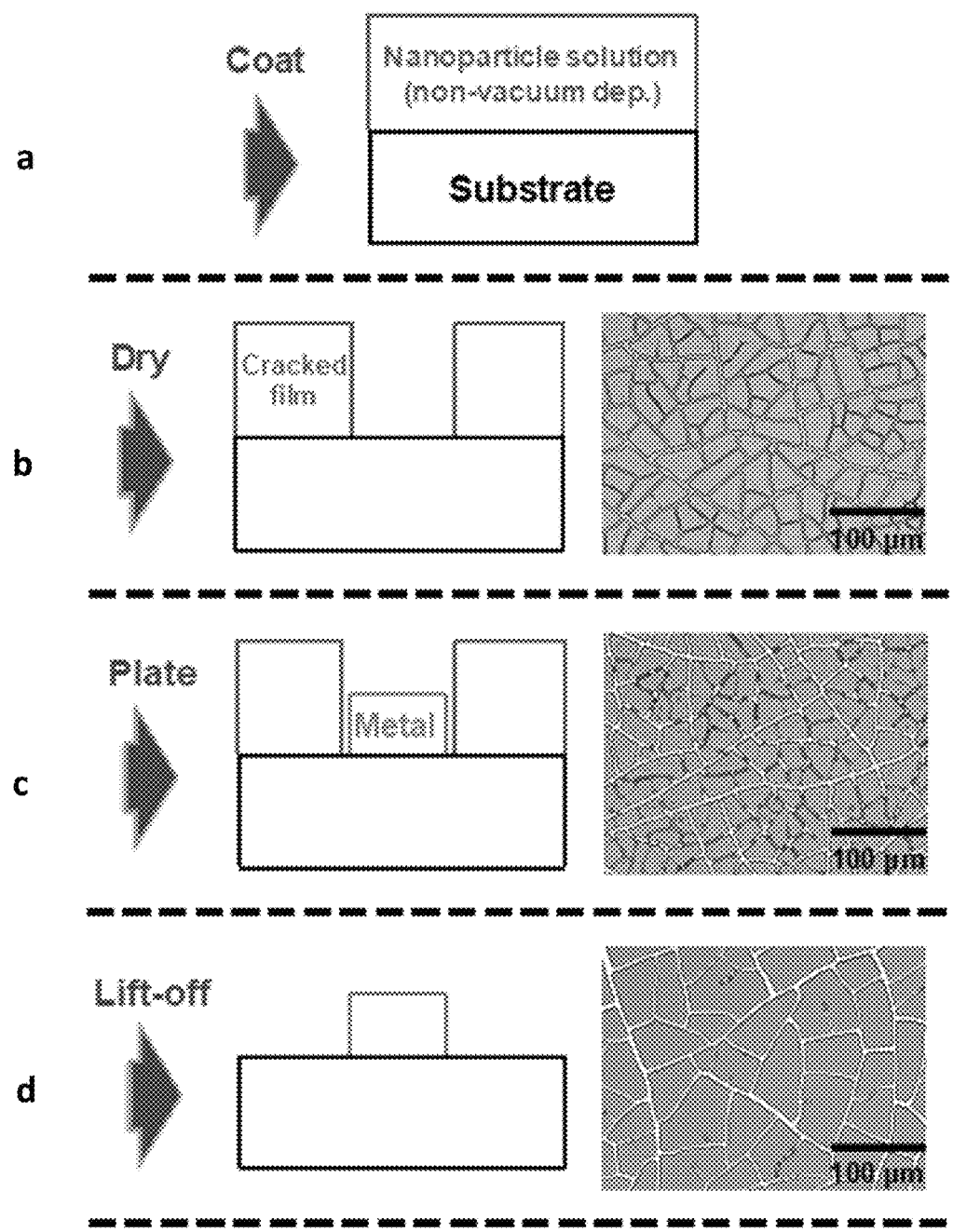
FIG. 1 depicts a cracked film lithography (CFL) schematic with FIG. 1a, coating a substrate with a nanoparticle solution, FIG. 1b with micrographs showing a crack template, FIG. 1c showing the template after electroplating metal, and FIG. 1d the grid after template lift-off.

Compositions and methods using cracked film lithography (CFL) to fabricate metal grids for transparent contacts in solar cells are disclosed herein. The underlying physics of drying-induced cracks were well-predicted by an empirical correlation relating crack spacing to capillary pressure. CFL is primarily controlled by varying the crack template thickness, which establishes a three-way tradeoff between the areal density of cracks, crack width, and spacing between cracks, which in turn determine final grid transmittance, grid sheet resistance, and the semiconductor resistance for a given solar cell. Since CFL uses a lift-off process, an additional constraint is that the metal thickness must be less than ⅓ of the crack template thickness. The transmittance/grid sheet resistance/wire spacing tradeoffs measured in this work were used to calculate solar cell performance: CFL-patterned grids should outperform screen-printed grids for narrow cells (0.5–2 cm wide) and/or cells with high semiconductor sheet resistance (greater than 100 Ω/sq.), making CFL attractive for monolithically-integrated thin-film photovoltaic modules.

Cracked film lithography (CFL) is an emerging method for patterning transparent conductive metal grids. CFL can be vacuum- and Ag-free, and it forms more durable grids than nanowire approaches. In spite of CFL's promising transmittance/grid sheet resistance/wire spacing tradeoffs, previous solar cell demonstrations have had relatively low performance. Disclosed herein are methods that have introduced macroscopic nonuniformities in the grids to improve the short-circuit current density/fill factor tradeoff in small area $Cu(In,Ga)Se_2$ cells. The performance of optimized baseline grids was matched by CFL grids with microscopic openings and macroscopic patterns, culminating in a 19.3% efficient cell. Simulations show that uniform CFL grids are enhanced by patterning because it leads to better balance among shadowing, grid resistance and transparent conductive oxide resistance losses. Thin-film module efficiency calculations were performed to highlight the performance gains that metal grids can enable by eliminating the transparent conductive oxide losses and widening monoliths. Adding the patterned CFL grids demonstrated in this work to CIGS modules is predicted to reach 0.7% higher efficiency (absolute) than screen-printed grids.

The transparent conduction performance of metal grids has a unique advantage over transparent conductive oxides (TCOs): Their thicknesses can be increased until grid resistance becomes negligible, without any penalty in transmittance. Theoretical investigations have further shown that all photovoltaic (PV) absorber technologies can benefit from improving metal grids. In spite of this promise, to date there is no scalable process for fabricating high-performance grids, outside of the high-temperature fired metal inks used in most Si modules. The industry-standard Ag inks suffer from low aspect ratios (height/width of 0.1-0.3) and minimum wire widths of about 50 μm. Increasing the aspect ratio and decreasing the wire width stands to improve performance in Si as well as other PV absorbers. As wire width is narrowed, wire spacing can be reduced at a given transmittance, which diminishes the resistive loss in the semiconductor. Thus, there is a need for a low-cost way to fabricate metal macro- and micro-grids.

First reported in 2013, cracked film lithography (CFL; see schematic in FIG. 1) is a technique for patterning metal grids that has several advantages over alternative transparent conductors: (1) Metal grids are grown directly on substrates, leading to high quality semiconductor/metal interfaces, (2) Metal can be electrodeposited to keep the process vacuum-free, allowing fast fabrication times (ca. 5 min) and low capital expenditure, (3) Wires down to about 0.7 μm can be patterned (with about 8 μm spacing), which accommodates highly resistive semiconductor substrates while avoiding the issue of accelerated degradation in nanowires. In particular, metal wires with nanometer-scale diameters are known to have poor short- and long-term durability due to Joule heating, quantum-confinement-induced melting point depression, and high surface area/volume ratios that lead to failure through corrosion. These CFL assets suggest that, despite being solution-grown, CFL-patterned grids can improve on the performance/durability of solution-synthesized Ag nanowires. Additionally, CFL metal micro-grids can act as an intermediate between transparent conductive oxides (TCOs) and metal macro-grids, where hierarchies are a well-known route to better transparent conduction.

As mentioned above, CFL grids can be low-cost and should have durability similar to typical metal grids in PV modules. However, CFL has only been used in relatively low-performance solar cells so far (13.8% hybrid organic-inorganic perovskite (0.09 $cm^2$), 11.2% monocrystalline Si, 5.9% amorphous Si, 4.5% dye-sensitized, 19 and 2.3% organic). Thus, there is a gap in the knowledgebase which this study has begun to fill by identifying the limits of controlling crack behavior, transferring the pattern to metal grids, and how these affect final transparent conduction performance. The following features of CFL were identified as critical to limiting its performance: Crack template thickness controls the crack width, crack spacing and maximum metal thickness allowable for quality lift-off. In turn, these three parameters determine the transmittance and sheet resistance of the metal grid, as well as specifying what semiconductor resistance would be incurred between the grid lines for a given application. In this way, template thickness constrains CFL to a three-way tradeoff of transmittance/grid sheet resistance/wire spacing. In spite of this fundamental limitation, the transmittance/sheet resistance tradeoffs measured at given wire spacings in this work are still highly attractive for PV, particularly monolithically-interconnected thin-film modules.

Why Metal Grids?

The landscape of photovoltaic (PV) absorber technologies is rapidly changing, which makes it difficult to predict what absorber(s) will enjoy giga- and tera-watt deployment in the coming decades. In contrast, it is certain that low-cost manufacturing of high-performance and high-durability transparent conductors (TCs) will be valuable. Due to their broad application in PV, next-generation TCs are critical to the future of solar power. Here, "next-generation" refers to a process and/or material that breaks through historical limits to transparent conductive oxides (TCOs), their alternatives, as well as screen-printed Ag macro-grids. The limits of TCOs are well-known: P-type TCO mobilities are too low for PV;1 the tradeoffs in transmittance/sheet resistance (T/Rsh) and carrier concentration/mobility are established for every material; free carrier absorption limits near-infrared (NIR) T, deteriorating narrow band gap absorber performance; indium tin oxide (ITO) is too brittle for flexible substrates; vacuum sputtering is relatively expensive; oxides are incompatible with mono-Si. The previously-explored alternatives to TCOs also have severe drawbacks: Solution-synthesized Ag nanowires are highly unstable under typical operating conditions, while carbon nanotubes and graphene are both too resistive. Very recently, new strategies have emerged for patterning metal micro-grids (MMGs)—which have better T/Rsh tradeoffs than ITO in theory and practice, use inexpensive processes, are flexible, and exhibit low degradation rates under mechanical stress and damp heat. These MMGs have wire diameters wider than 500 nm, which avoids the nanowire stability issues. Moreover, MMGs form robust wire junctions and have low contact resistances, all of which places them in a different category from solution-synthesized Ag nanowires. Metal grids with greater work functions can act as p-type TCs, and they have better NIR T for modules with low band gaps and tandems. These considerations make MMGs the most viable candidate for next-generation TCs, and a promising way to reduce the levelized cost of PV electricity, regardless of which absorbers dominate the future market.

The $T/R_{sh}$,grid data of emerging patterned grids are promising, but they are not the only requirement for high-performance MMG-based solar cells. Grids are nonuniform, which induces lateral conduction in the contacted semiconductor, introducing resistance that is proportional to the square of the spacing between grating wires. Therefore, TC performance depends on wire spacing as well as $T/R_{sh}$,grid, making direct comparisons with TCO $T/R_{sh}$ tradeoffs and figures of merit misleading. In practice, the minimum wire spacing is determined by the minimum wire width that can be formed with a given process (at constant T). Low-cost lithography processes have now been used to reduce wire width from its value in industry-standard screen-printing (50 μm) to unprecedented values (50 nm). This decrease by three orders of magnitude has quietly transformed the possibilities for metal grids in solar cells. The new theoretical limits for metal grid performance are only recently being developed, and experimental validation is almost completely lacking. Previous work has explored wave optics and plasmon effects of MMGs, but these are unnecessary for high-performance MMG-based solar cells. Where TCOs and metal macro-grids have historically been used to conduct current over short and long solar cell widths, respectively, MMGs may help bridge the technological gap between them.

Why Cracked Film Lithography?

Figures 17A, 17B, 17C, 17D:
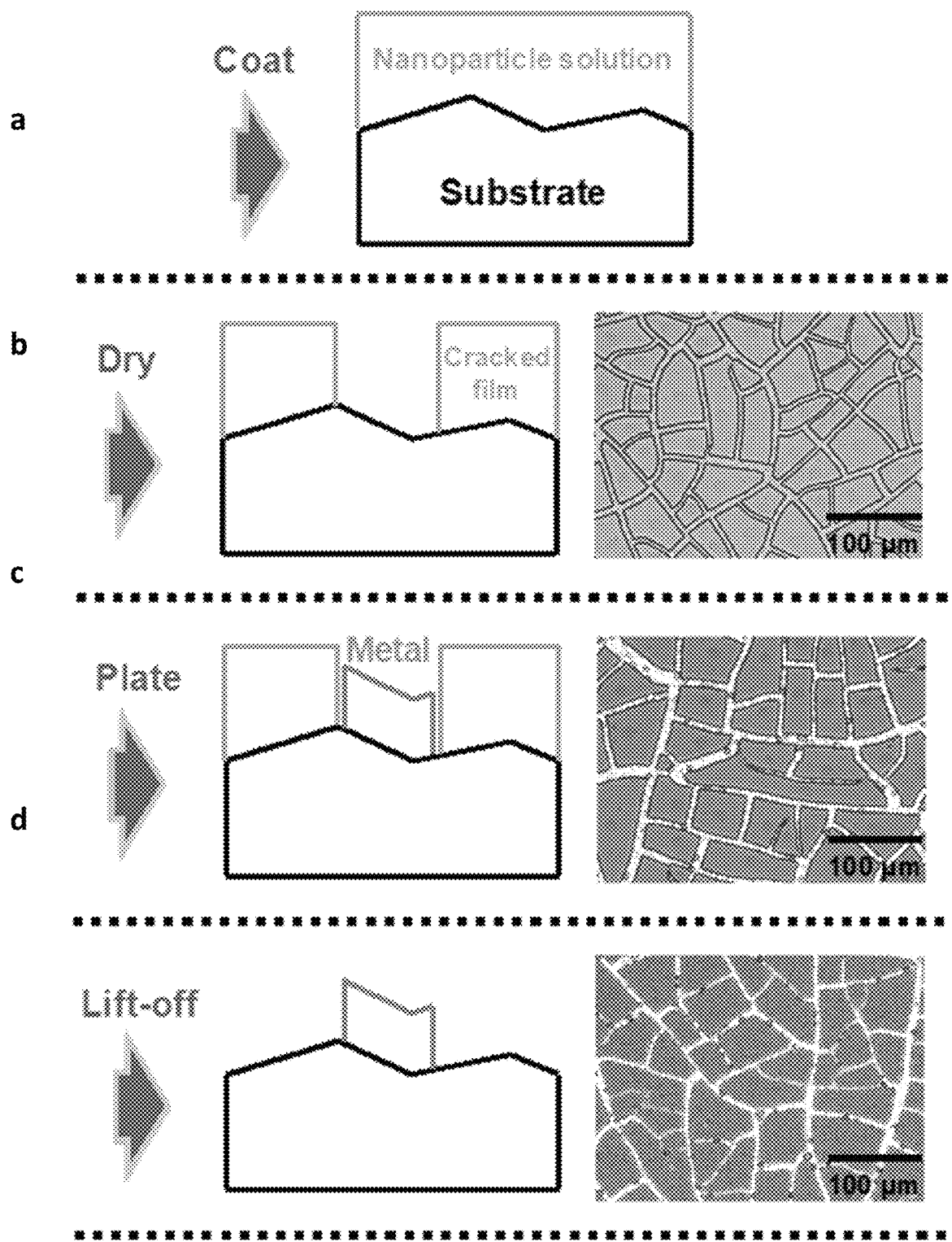
FIG. 17 is a schematic of the CFL process, as demonstrated by coating a substrate with a nanoparticle solution (FIG. 17a), drying (FIG. 17b), Cu electroplating onto rough, polycrystalline CIGS/CdS/i-ZnO/Al:ZnO device stack substrates (FIG. 17c) and lift-off (FIG. 17d), also depicted in respective optical micrographs.

There are many low-cost nano- and micro-lithography processes being developed to tap the potential of metal grids. This work is focused on one of the least researched: Cracked film lithography. In CFL, a suspension of nanoparticles is deposited onto a substrate, where solvent evaporation cracks the drying film, naturally producing a template for metal deposition and subsequent lift-off (FIG. 17). Although there are only seven reports of CFL for MMGs in solar cells, it has major advantages over other lithographic processes: The metal is directly deposited onto the underlying semiconductor to greatly reduce contact resistance, unlike transfer or lamination processes, electrospinning, and solution nanowires. The patterning is compatible with rough substrates, unlike nanoimprint lithography. The lift-off is compatible with active substrates, unlike etch-based processes. The pattern material is inexpensive ($TiO_2$ or acrylic), unlike nanoimprint and photolithography resists. Cracks naturally form hierarchical branching patterns that can benefit large-area performance, unlike periodic patterns. Moreover, CFL is done at low temperature, giving it an advantage over high-temperature fired Ag paste and certain TCOs that require elevated temperatures to form quality sputtered films (ITO and $F:SnO_2$). Low temperatures are necessary for certain PV applications (e.g., Si heterojunction, Cu(In,Ga)Se$_2$ (CIGS) front, CdTe back, and hybrid organic-inorganic perovskite back contacts). Combining CFL with metal electroless/electrodeposition, reduces process time and removes the need for expensive vacuum equipment. Furthermore, metal only electrodeposits on the semiconducting cathode, which assists lift-off and enhances metal utilization (FIG. 17).

While the $T/R_{sh}$, grid/wire spacing tradeoffs of CFL-patterned grids have shown promise, translating those results to high-performance TCs has been challenging. Of the seven reports of CFL in solar cells, only two have achieved moderate efficiency: 11.2% in a 0.7 cm$^2$ monocrystalline Si cell and 13.8% in a 0.09 cm$^2$ hybrid organic-inorganic perovskite cell. Thus, there remain open questions about CFL's compatibility with actual solar cell materials and device architectures, as well as what applications are best-suited. This work aims to answer those questions—demonstrating how CFL can reach 19.3% efficiency, and why it stands to outperform standard screen-printed grids in thin-film modules while keeping cost and degradation low.

Experimental $TiO_2$ nanoparticles ("P25" or "aeroxide"; 21 nm primary particle diameter) were purchased from Fisher Scientific and mixed with de-ionized (DI) water to form a 30% wt./vol. suspension. Surfactant-free polystyrene (PS) nanoparticle (80±20 nm diameter) suspensions were obtained from Magsphere, Inc. (Pasadena, CA, USA). The as-purchased solutions were concentrated to 30% wt./vol. by allowing the water solvent to evaporate off over the course of days. Poly(methyl methacrylate) (PMMA) nanoparticle (40-80 nm diameter) suspensions were purchased from Jinhua Mengni Cosmetics Co., Ltd. (Zhejiang, China). The solutions, sold as "crackle nail polish," were diluted to 30% wt./vol. by adding DI water. To reduce agglomeration, $TiO_2$ suspensions were sonicated for >20 min before using, and then used within 20 min. The polymer suspensions were not sonicated. The crack templates were blade coated, and the thickness of the final $TiO_2$ templates was controlled by adjusting the blade height from 50 to 350 μm. The polymer suspensions had much lower viscosity, so final thickness was dominated by the volume of solution that was blade-coated, relative to the area of the substrate (2.6-9.0 μL/cm$^2$). Soda-lime glass (SLG) substrates were cleaned by sonication in warm Liquinox solution, DI water rinse, and final rinsing in a spin-rinse-dryer. Just before crack template coating, substrates were $O_2$ plasma-cleaned for 15 min. After coating, suspensions dried in seconds. Solvent evaporation rate was estimated by measuring the evaporation rate of water from petri dishes over the course of hours (1.8.10-8 to 3.9.10-7 m/s, depending on air flow). Cu was deposited by e-beam evaporation ($TiO_2$ and PMMA). For PS templates, Cu was DC sputtered to enhance pattern transfer fidelity. Lift-off was performed by immersing the samples in water (for $TiO_2$) or tetrahydrofuran (for PS and PMMA) and sonicating for 30-60 s. Stylus profilometry was used to determine template and metal thicknesses (Dektak 8). Ultraviolet-visible spectroscopy was used to measure transmittance of samples at 300-1350 nm (Cary 5000). The transmittance of baseline glass substrates was used to calculate the transmittance of the grids themselves ($T_{grids}=T_{measured}/T_{substrate}$). Optical micrographs were captured with a digital camera at 30-5000× magnification (Keyence) on an anti-vibration table. The crack/wire width/spacing was quantified by binarizing micrographs and applying a Euclidean distance transform function to map the maximum wire and spacing width pixel by pixel. Sheet resistance was measured with a non-contact eddy current measurement system with sensitivity down to 105 Ω/sq. (Delcom). The non-contact measurements were validated by soldering indium pads to the grids and measuring sheet resistance in a van der Pauw configuration.

For the electroplating demonstration, Tec 15 glass (with an $F:SnO_2$ coating; purchased from Pilkington) was coated with PMMA templates, pre-baked in air at 130° C. for 5 min, 17 then immersed in bright Cu electroplating solution (obtained from Millipore Sigma). Plating lasted 30 s at 4 V and 140 mA/cm$^2$ with a cathode-to-anode distance of 3 cm. For the substrate surface energy micrograph data, $TiO_2$ solutions with improved wetting (10% vol./vol. dimethylsulfoxide) were drop-cast onto substrates of SLG, SLG coated with RF sputtered Al:ZnO, and $F:SnO_2$ (Tec 15) that had or had not been $O_2$ plasma-cleaned for 15 min. For the surface energy on SLG substrates, 30 μL of the sonicated $TiO_2$-water suspension was dispensed, and a goniometer was used to extract the contact angle from a digital camera image. The cracked films were coated using a blade height of 100 μm and velocity of 16 mm/s.

Experimental

CIGS solar cells were fabricated by standard processes: soda-lime glass (SLG; 3 in×3 in) was cleaned and an 800 nm Mo back contact was DC sputtered. 3-stage CIGS was co-evaporated at 600° C., followed by an in situ KF post-deposition treatment at 350° C. for 5-10 min (25-35 nm KF with a Se/K flux ratio of ~50). The CIGS was about 2.5 μm thick and had a Cu/(Ga+In) molar composition of about 0.9 and Ga/(Ga+In) of about 0.3, as measured by X-ray fluorescence. After rinsing absorbers 3 min in 3% vol./vol. $NH_4OH$ solution at 65° C., chemical bath deposition of about 50 nm CdS buffer was performed (about 8 min in 100 mL de-ionized (DI) $H_2O$: 12.5 mL 29% $NH_4OH$: 10 mL 0.015 M $CdSO_{4:\,5}$ mL 1.5 M thiourea ($CH_4N_2S$) at 65° C.).

Next, 90 nm of intrinsic ZnO was RF sputtered, followed by 120 nm of Al:ZnO. The $R_{sh}$,TCO of the TCO stack was about 80 Ω/sq. Baseline grids of 50 nm Ni/3 μm Al were e-beam evaporated through shadow masks (design in FIG. 18) with a 3.6% footprint (96.4% T). Isolation of 9 mm×4.75 mm devices (~0.42 cm$^2$) was completed by photolithography and etching back to the CIGS layer in 4% vol./vol. HCl. Current density-voltage (JV) measurements were performed on a temperature-controlled stage at 25° C. A xenon lamp was used to simulate 1 sun AM1.5 G by calibration to independently certified CIGS solar cells with the same effective band gap (~1.15 eV, as estimated from the quantum efficiency cutoff). Where noted, anti-reflective (AR) coatings (120 nm $MgF_2$) were e-beam evaporated onto cells to enhance current.

Figures 18A, 18B:
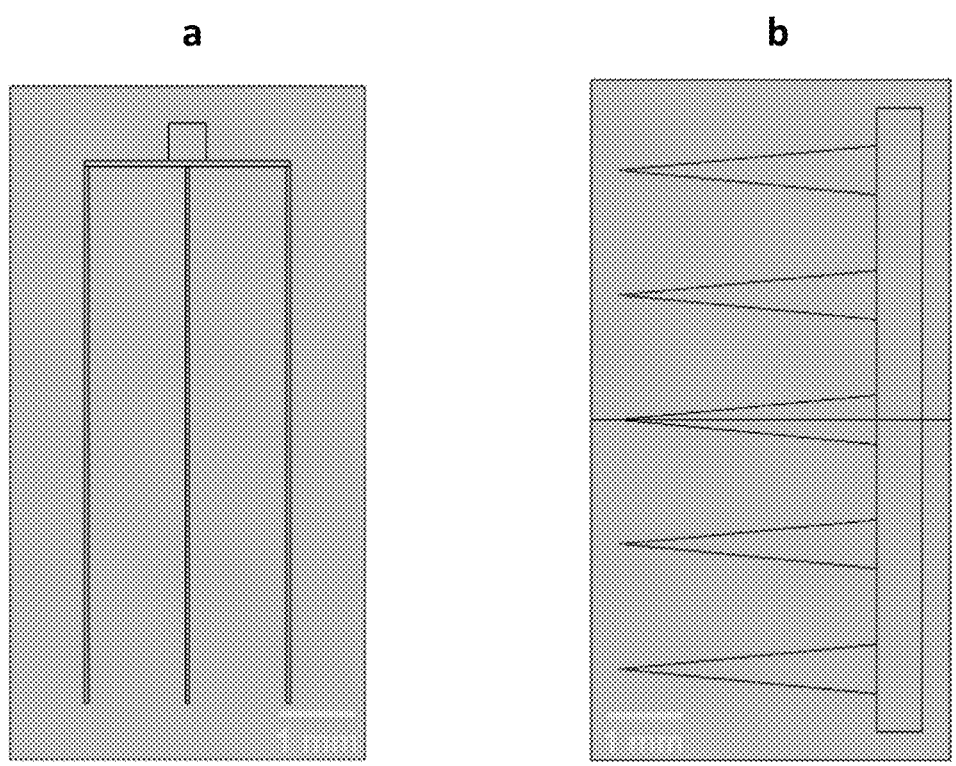
FIG. 18 depicts (FIG. 18a) a layout of the baseline grid, which had a footprint of 3.6% (T=96.4%), and (FIG. 18b) layout of the shadow mask for patterned CFL grids, which had a footprint of 24.5% (T of 75.5%).

Poly(methyl methacrylate) (PMMA) nanoparticle (40-80 nm diameter) suspensions were purchased from Jinhua Mengni Cosmetics Co., Ltd. (Zhejiang, China). The solutions were sold as "crackle nail polish," and were diluted to 30% wt./vol. with DI water. Solutions were either blade coated (150 μm blade height) with 2.6-9.0 μL/cm$^2$, or spin-coated at 180-6000 rpm. The substrates were 1 in×1.5 in solar cell stacks up to the Al:ZnO layer that had been $O_2$ plasma-cleaned for 15 min to improve wetting. After coating, the templates dried and cracked in seconds. Next, 3 μm of Cu or 50 nm Ni/3 μm of Al was e-beam evaporated through the crack templates and a shadow mask that either confined the metal to the device mesa area, or confined the metal to a tapered finger geometry with even less area ("patterned"; FIG. 18). The pattern was chosen to minimize losses, but slightly better designs may exist. Immersing samples in tetrahydrofuran and sonicating for 30-60 s led to lift-off. Finally, photolithography was used to isolate the p-n junction mesas. Template and metal thicknesses were measured by contact profilometry (Dektak 8). A digital camera was used to capture optical micrographs at 30-5000× magnification (Keyence) on an anti-vibration table. Throughout this work, grid T is scaled to the substrate ($T_{grids}=T_{measured}/T_{substrate}$).

For the electroplating demonstration, SLG/Mo/CIGS/CdS/i-ZnO/Al:ZnO device stacks were coated with PMMA crack templates, pre-baked in air at 130° C. for 5 min, then immersed in bright Cu electroplating solution (Millipore Sigma). Samples were plated for 30 s at 4 V and 140 mA/cm$^2$ using a cathode-to-anode distance of 3 cm. The narrowest wires possible for CFL were used for the degradation study: Surfactant-free polystyrene nanoparticle suspensions (80 nm diameter; Magsphere, Inc., Pasadena, CA, USA) were concentrated to 30% wt./vol. by evaporating off the water solvent. The suspensions were blade-coated onto SLG with a blade height of 150 μm and 3.6-7.2 μL/cm$^2$, followed by DC sputtering of 500 nm Cu and lift-off by ultrasonication in DI water.

Finite element method (FEM) simulations were performed to estimate resistance in the TCO and grids for the small-area solar cells fabricated in this study. Resistive power loss for lateral current transport in the TCO is proportional to grid wire spacing squared, so conduction to the CFL grid wires with ca. 25 μm spacing led to negligible loss in the TCO (<4.10-5 mW/cm$^2$, assuming an idealized square grid shape). On the other hand, the spacings of about 1 mm for the patterned CFL and baseline cases were substantial, so the CFL grid networks were modeled as homogeneous films with $T/R_{sh}$, grid values extracted from the samples in FIGS. 19 and 20. Power loss density due to TCO and grid resistance were simulated for Rsh,TCO=80 Ω/sq., 39.6 mA/cm$^2$ current density, with a small grounded area where the Kelvin probes were placed in the experiments. Power loss density from shadowing was estimated by multiplying grid footprint by the world record CIGS cell PV parameters (39.6 mA/cm$^2$; 734 mV; 80.4% fill factor).

Figure 21:
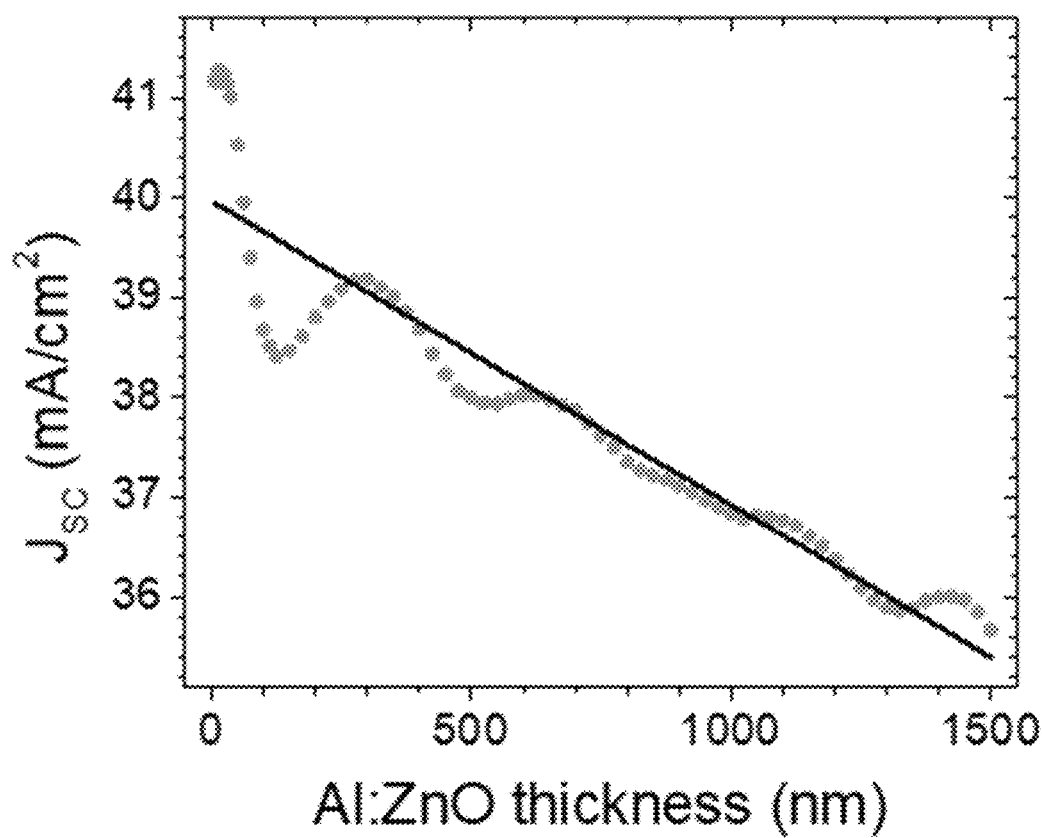
FIG. 21 depicts calculated short-circuit current density as a function of Al:ZnO thickness. Fresnel calculations for transmittance through the optical stack were weighted to AM1.5 G, integrated and scaled to world record JSC. A linear fit (black line) to the raw data (orange circles) was used to wash out interference fringes.

For monolithically-integrated module efficiency calculations, one-dimensional Fresnel calculations were performed using the transfer-matrix method. Layer thicknesses and material optical constants were used to calculate the transmittance of above-band gap photons (400-1250 nm) through an industry-standard stack of 50 nm Zn(O,S,OH)/50 nm $Zn_{0.8}Mg_{0.2}O$/B:ZnO (Al:ZnO optical constants were used for lack of B:ZnO data) layers and into the CIGS layer. The calculated transmittance was weighted to the AM1.5 G spectrum, integrated and scaled to the world record short-circuit current density (JSC). JSC was then plotted as a function of TCO (Al:ZnO) thickness (6-1500 nm), and the data were fit to a linear function that washed out the interference fringes that are typically not observed in actual polycrystalline stacks (FIG. 21). $R_{sh}$,TCO was also a function of TCO thickness (using $R_{sh}$,TCO=80 Ω/sq. at an Al:ZnO thickness of 120 nm), leading to fully specified T/$R_{sh}$,TCO tradeoffs.

Module efficiency calculations were done using a previously developed approximation for fill factor (FF) 44 and straightforward assumptions for monolithic integration parameters: Mo back contact sheet resistance of 0.5 Ω/sq., Mo/Al:ZnO contact resistance of 8.10-4 Ω·cm$^2$ for gridded and grid-free designs, P1, P2 and P3 scribes 50 μm wide spaced 50 μm apart (total dead area of 250 μm), 44 CIGS sheet resistance of 105 Ω/sq. (for both grid-free and gridded shunt resistance), small cell PV parameters extracted from the world record CIGS current density-voltage (JV) data (diode quality factor of 1.5, JSC of 39.6 mA/cm$^2$, VOC of 734 mV, and FF of 80.4%), and a temperature of 300 K.

Figure 22:
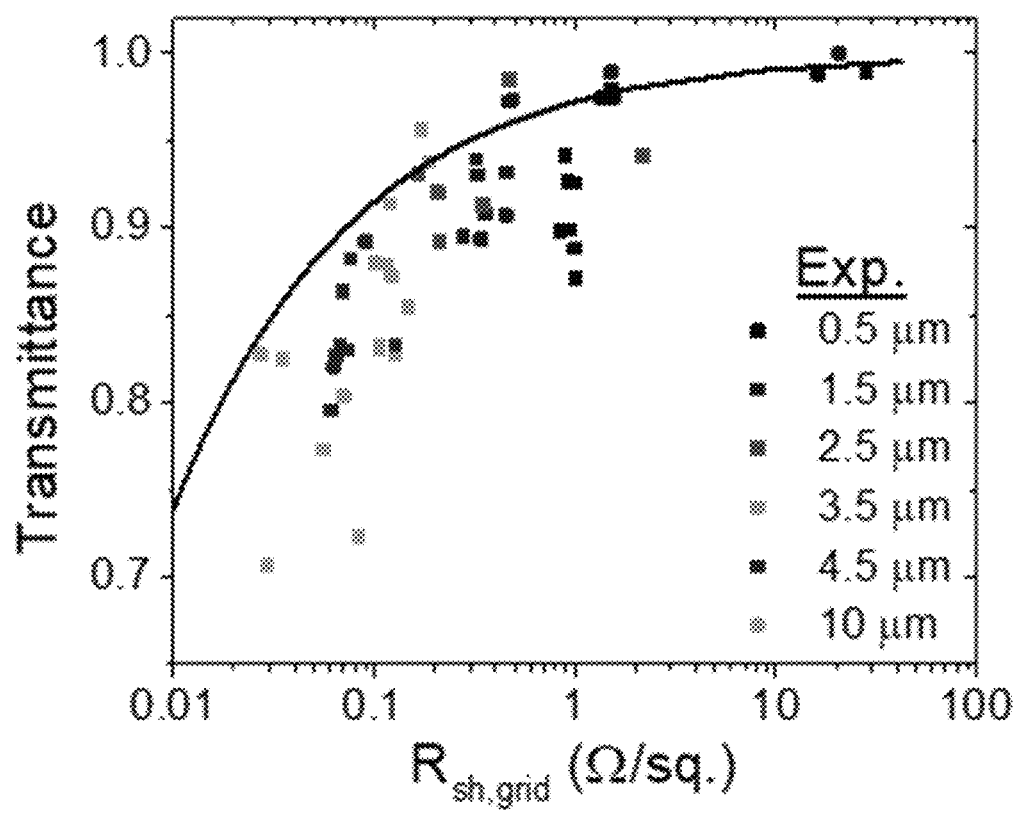
FIG. 22 depicts experimentally measured transmittance/grid sheet resistance tradeoffs for PMMA crack templates and Cu with varied thickness (squares), along with the best possible T/Rsh,grid tradeoff (black line), which constrained metal thickness to 35% of the crack template thickness.

To add grids, extra distributed resistances were included: For the baseline and best possible grids, TCO resistance was simulated for an optimal grating geometry, then scaled to the given wire spacing. Low temperature screen-printed grids were assumed to have a wire width of 70 μm, thickness of 21 μm and resistivity of 1.2.10-5 Ω·cm, while the best possible grids had 1 μm wide wires, 100 μm thickness and copper's resistivity (1.68.10-6 Ω·cm). T/$R_{sh}$,grid/wire spacing/crack template thickness data was previously measured for PMMA.14 In this work, $R_{sh}$,grid was scaled so that metal thickness was 35% of the crack template thickness, leading to a function in line with the experimental data (FIG. 22). For uniform CFL grid areas, losses in the TCO due to current transport to individual crack-patterned wires were calculated by approximating the crack openings with idealized square grids, 11 and scaling to the mean experimental CFL wire spacing data for PMMA templates. Wire spacing was quantified by binarizing micrographs and using a Euclidean distance transform. For patterned CFL, TCO and grid resistance for current flow to and within the macro-tapered fingers was simulated at different $R_{sh}$,TCO, $R_{sh}$,grid and monolith width combinations, and the results were interpolated. Optimal efficiencies were calculated by maximizing the efficiency functions with respect to $R_{sh}$,TCO, monolith width, and the T/$R_{sh}$,grid/wire spacing tradeoff.

Physics of Cracking

There have been many investigations into the cracking behavior of drying films. The concept of drying-induced cracking is relatively straightforward: Solvent evaporation contracts the film's volume, leading to stress that is relieved through the formation and growth of fractures. Nevertheless, casting the physical situation in a framework with widespread applicability and utility has proven difficult. Others have performed an analysis that scaled crack spacing and capillary pressure, finally arriving at an empirical fit to data spanning four orders of magnitude. Their simple model used readily available parameters to predict crack spacing:

$$\text{Scaled capillary pressure} = \frac{20}{75} \cdot \left(\frac{3 \cdot \gamma \cdot \mu_{disp}}{E}\right)^{1/2} \cdot \frac{R \cdot (1-\phi)^2}{\mu_{solv} \cdot \phi^2 \cdot H} \quad \text{Equation (1)}$$

$$\text{Scaled crack spacing} = \frac{75 \cdot y \cdot \mu_{solv} \cdot \phi^2}{20 \cdot R \cdot (1-\phi)^2} \cdot \left(\frac{E^3}{3 \cdot \mu_{disp} \cdot \gamma^3}\right)^{1/4} \quad \text{Equation (2)}$$

Figure 2:
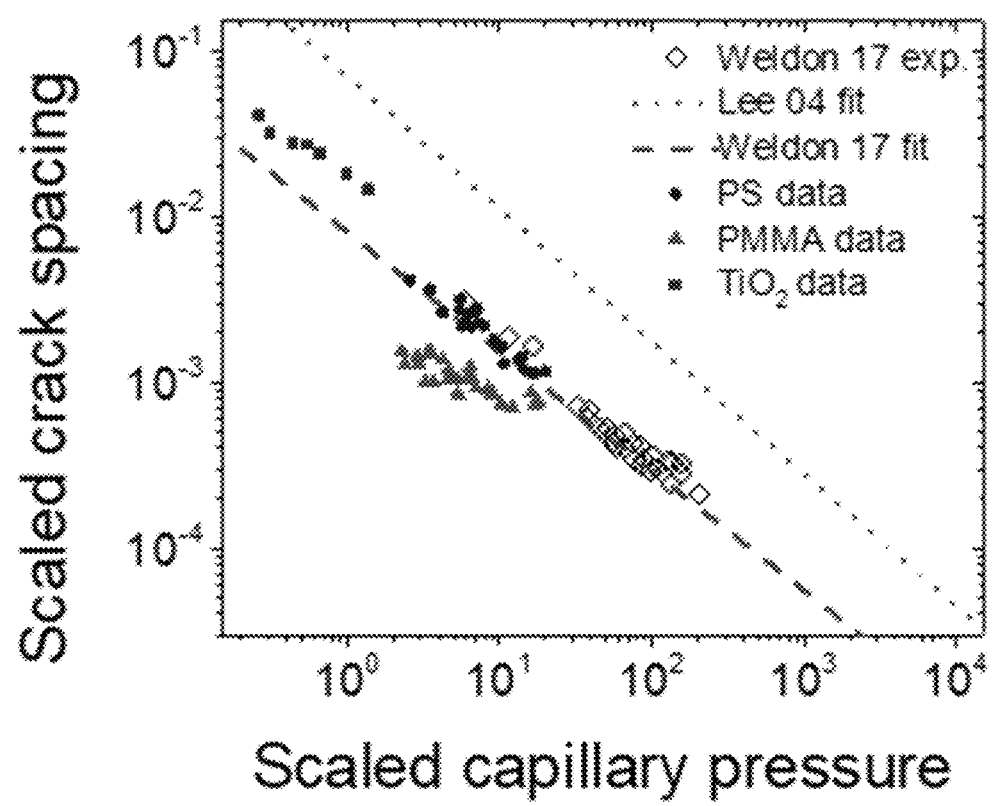
FIG. 2 depicts scaled crack spacing as a function of scaled capillary pressure (defined in eqs. 1 and 2): Previous experimental data (hollow black diamonds), original empirical fit (dotted line), empirical fit to two-dimensional drying fronts (dashed line), surfactant-free polystyrene (PS) nanoparticle (80±20 nm diameter) (blue circles), poly(methyl methacrylate) (PMMA) nanoparticle (40-80 nm diameter) (green triangles) and $TiO_2$ data (red squares).

Here, γ is solvent surface tension, $\mu_{disp}$ is dispersion viscosity (assumed to be that of the water solvent), R is particle radius, is final particle volume fraction (assumed to be that of close packing=0.64), E is solvent evaporation rate, $\mu_{solv}$ is solvent viscosity, H is dried film thickness, and y is crack spacing. After measuring evaporation rate and final film thickness, the scaled crack spacing and capillary pressure were calculated for this study's PS, PMMA and $TiO_2$ nanoparticle suspensions. The results are compared with the empirical fit in FIG. 2. Others have explored using a different cracking regime: Two-dimensional drying fronts, which have a modified characteristic fluid velocity. That work extracted a similar empirical fit using the same dimensionless parameters. The PS data measured in this work were fit particularly well with that correlation, while the $TiO_2$ and PMMA data deviated somewhat. Together, these correlations fit vast datasets, suggesting that the analysis' assumptions were appropriate, as well as being well-suited to regimes useful for transparent conduction applications. Despite the simplicity of eqs. (1) and (2), there are implicit interdependencies which are not always obvious. For instance, changing solvent affects surface tension, viscosity and evaporation rate, but it can also affect dried film thickness and the stability of the suspension, the latter of which can alter agglomeration and the effective particle radius. Therefore, the exploitation of these correlations for more sophisticated cracking control strategies will require experimental validation.

Template Thickness and Material Control CFL

Figure 3:
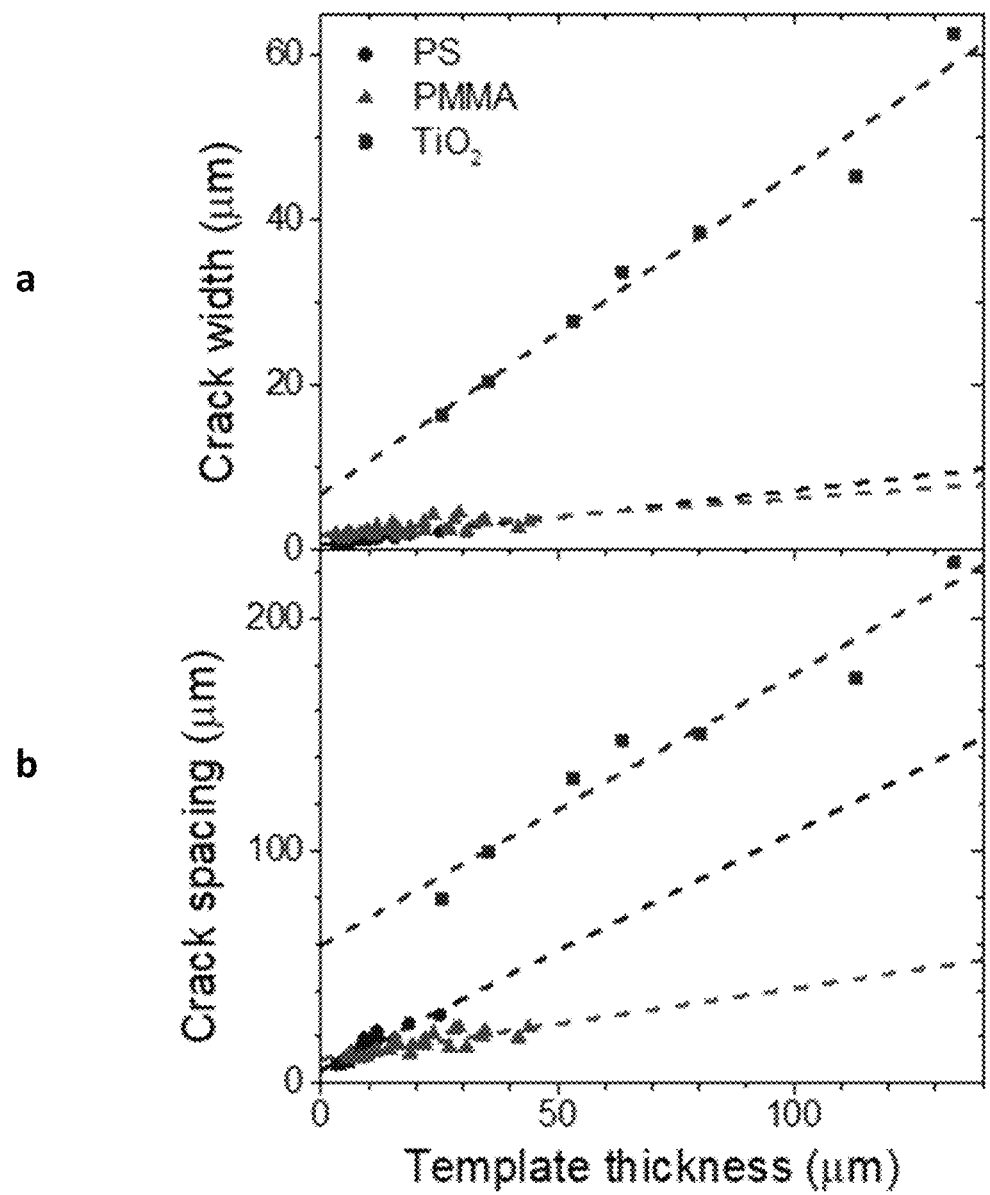
FIG. 3 depicts crack width (FIG. 3a) and spacing (FIG. 3b) as a function of crack template thickness for PS (blue circles), PMMA (green triangles), and $TiO_2$ (red squares). Dashed lines are linear least squares fits to each material's data.
Figure 4:
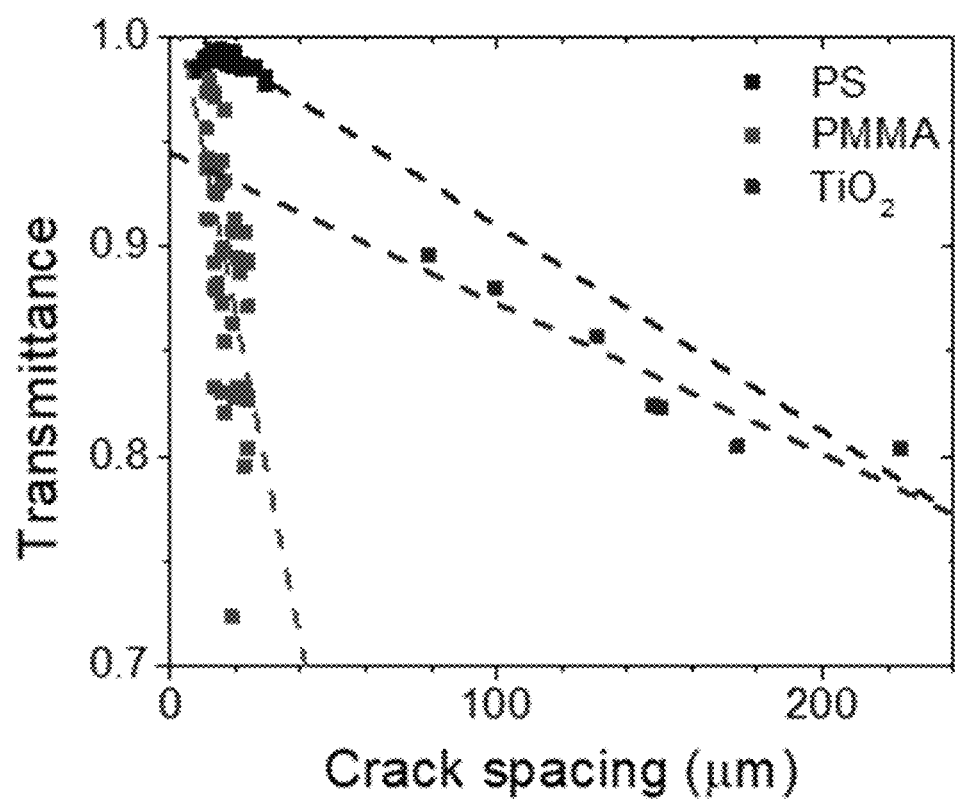
FIG. 4 depicts transmittance (450-890 nm) of the final grids after lift-off, as a function of crack spacing in the template for PS (blue circles), PMMA (green triangles), and $TiO_2$ (red squares). Dashed lines are linear least squares fits to each material's data.
Figure 5:
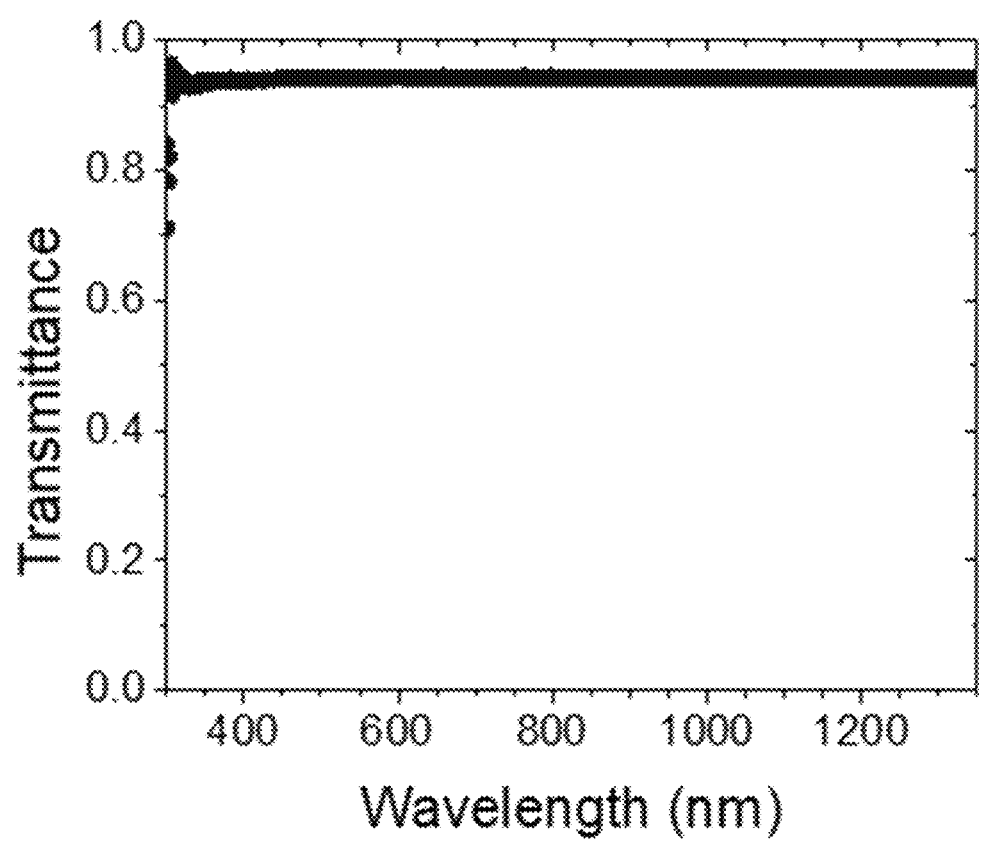
FIG. 5 depicts transmittance as a function of light wavelength for a grid patterned with PS.

Changing the crack template thickness is the primary means of controlling CFL. As template thickness is increased, cracks and crack spacings get wider (FIG. 3). This boosts the total crack footprint, or areal density, leading to lower transmittance and sheet resistance of the final metal grid. Transmittance of the final grid was found to correlate better with crack spacing (relative to crack width or template thickness; FIG. 4). As expected, transmittance did not vary with light wavelength (FIG. 5). This broadband transmittance gives the grids an advantage over TCOs, which absorb in the near-infrared—wavelengths that are critical to narrow band gap PV absorbers.

Figure 6:
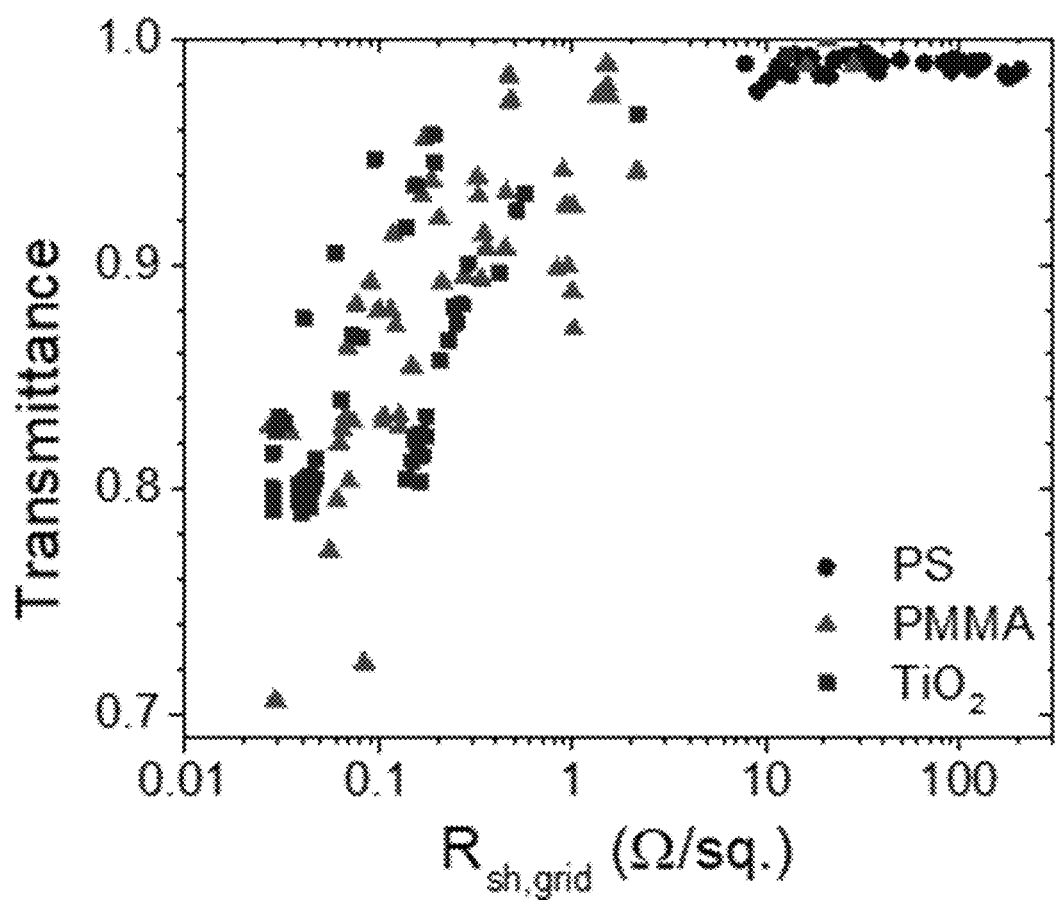
FIG. 6 depicts transmittance (450-890 nm) as a function of grid sheet resistance for PS (blue circles), PMMA (green triangles), and $TiO_2$ (red squares).

Every crack template material has a critical cracking thickness, below which no cracks form. As the Young's modulus of the crack template material is increased, its critical cracking thickness increases. In practice, this means that the $TiO_2$ suspensions (about 100 GPa Young's modulus) had thick crack templates (25-140 μm) that led to less transparent grids (T=0.8-0.9) with wider spacings (80-220 μm) and lower sheet resistance. PS and PMMA templates (3-4 GPa Young's modulus) had much thinner crack templates (3-45 μm), accessing higher transmittance grids and smaller wire spacing (8-30 μm) at the expense of sheet resistance (FIG. 6). The PS templates had slightly narrower crack widths and slightly wider crack spacings than PMMA, leading to superior transmittance. This difference is also observable in the shift from PS to PMMA in FIG. 2, and is not predicted by eqs. (1) and (2). It may relate to incorrect estimates for the equations' inputs (the PMMA solution has proprietary components), or to the particular properties of these nanoparticles (e.g., the surfactant-free PS is suspended with surface sulfate groups). Future work is needed to elucidate why PS had higher transmittance than PMMA in this work, and more generally how crack spacing can be varied independently from crack width. The data in FIG. 6 should not be directly compared with TCO transmittance/sheet resistance tradeoffs because: (1) TCO transmittance depends on the substrate (unlike grids), (2) TCO transmittance has wavelength dependence, so the choice of wavelength range biases the comparison (with longer wavelengths favoring grids), and (3) grids have nonuniformity that induces more resistance in the contacted semiconductor (unlike TCO films).

Substrate-Template Interaction

Figure 7:
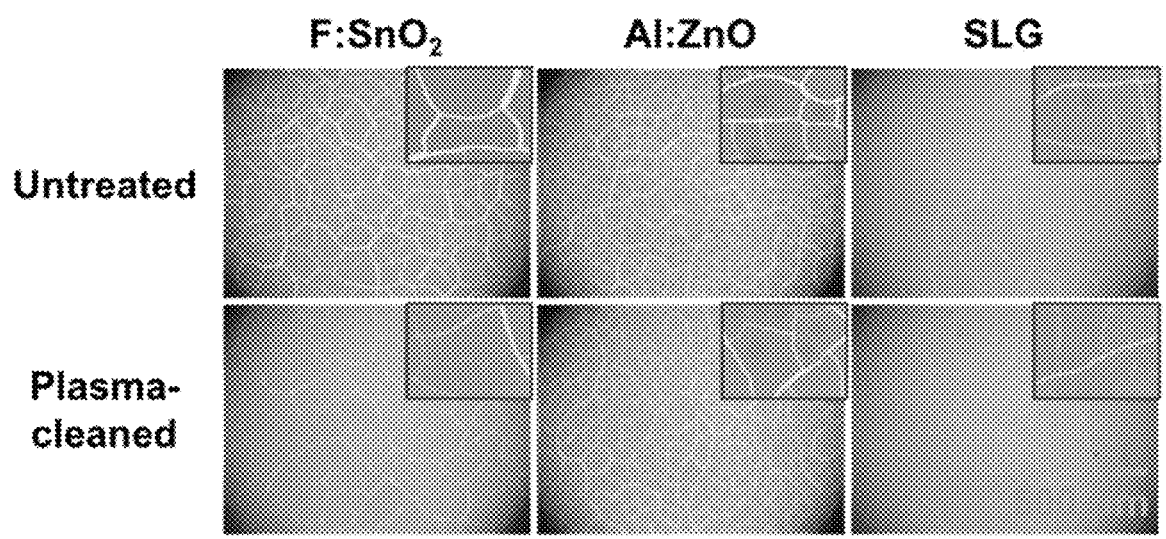
FIG. 7 depicts metal grids patterned by $TiO_2$ templates, where the substrate surface ($F:SnO_2$, $Al:ZnO$ or soda-lime glass (SLG)) and preparation (untreated or plasma-cleaned) strongly affected the crack/wire width. The inset scale bar is 100 µm.

The cracking model discussed above does not explicitly account for the template's material properties or its interaction with the substrate. As suggested by others, the refinement of this simple model may come from a more accurate estimate for capillary pressure. Instead of using the maximum possible capillary pressure, the actual yield stress, although difficult to access, would be more accurate. Indeed, it was observed in this work that substrate surface energy had a strong effect on cracking behavior. The effect was first observed for different substrates: The micrographs in FIG. 7 show that moving from F:SnO$_2$, to Al:ZnO, to SLG substrates narrowed the cracks and crack spacing (the final grid networks are shown to enhance contrast). O$_2$ plasma-cleaning prior to drop casting reduced the crack width for all three substrates as well. These data suggest that the interaction between the drying film and the substrate affects cracking, possibly through altering yield stress.

Figure 8:
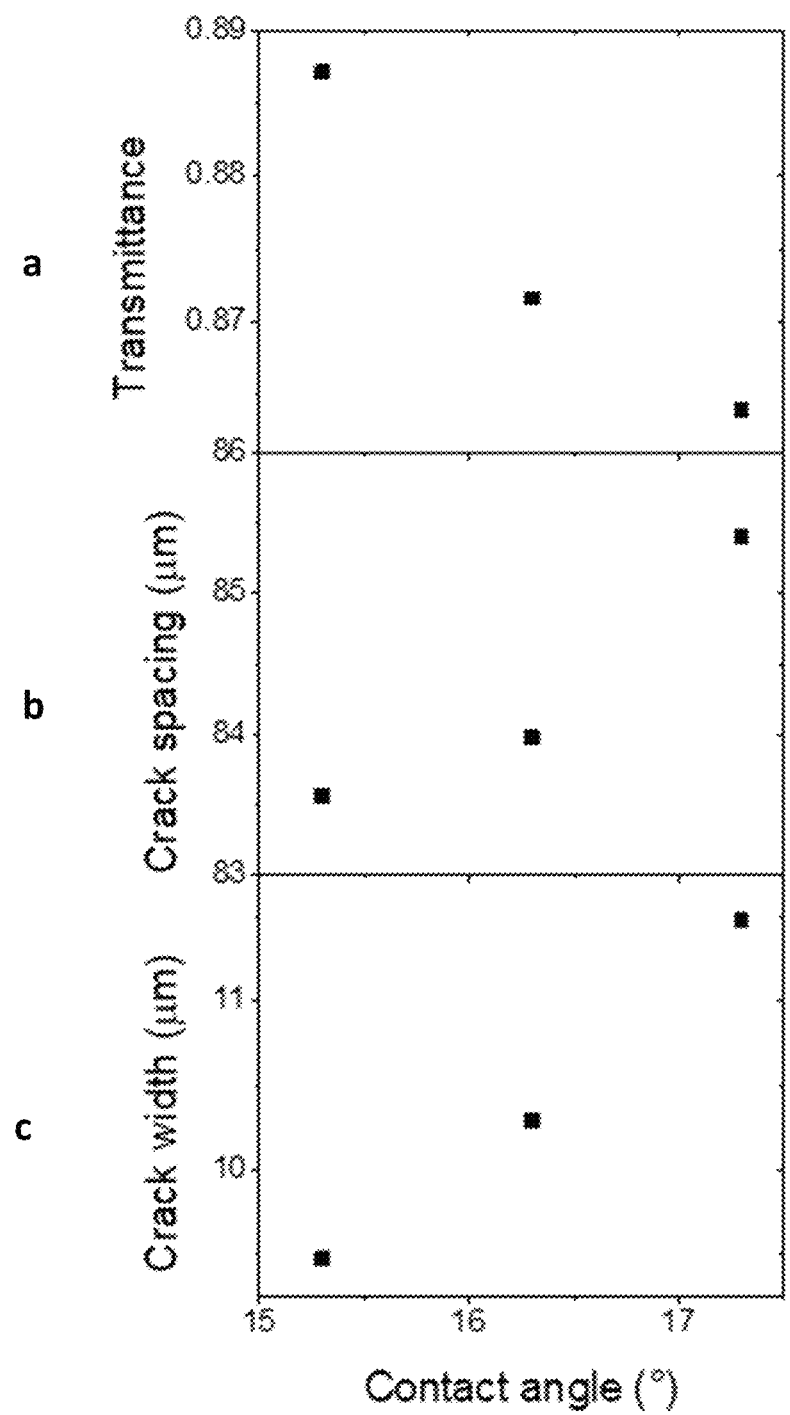
FIG. 8 depicts transmittance (FIG. 8a; 450-890 nm), crack spacing (FIG. 8b) and crack width (FIG. 8c) as a function of contact angle of the $TiO_2$ suspension on the substrate, which was varied by plasma-cleaning the substrate for 1.7, 5 or 15 min to establish 17.3°, 16.3° and 15.3° contact angles, respectively.

Increasing the duration of a plasma-clean on SLG substrates also systematically decreased crack width and spacing, increasing transmittance (FIG. 8). For FIG. 8, TiO$_2$ nanoparticles suspended in water were blade-coated onto SLG that had been plasma-cleaned for various durations. The plasma-clean decreased the solid-liquid interfacial energy, as evidenced by the decreasing contact angle. Combined, FIG. 7 and FIG. 8 show that the template-substrate interaction effect is independent of the film deposition method. A previous investigation proved that particle-substrate interactions in drying colloidal films changed cracking behavior. They found that more favorable interfacial energies decreased the critical stress intensity factor, making cracking more likely (increased number of cracks with narrowed widths). In this study, improved interfacial energy also narrowed crack width and spacing, leading to greater transmittance. Therefore, to achieve similar crack templates on substrates with poor wetting, thinner films should be deposited.

Crack Aspect Ratio

Figure 9:
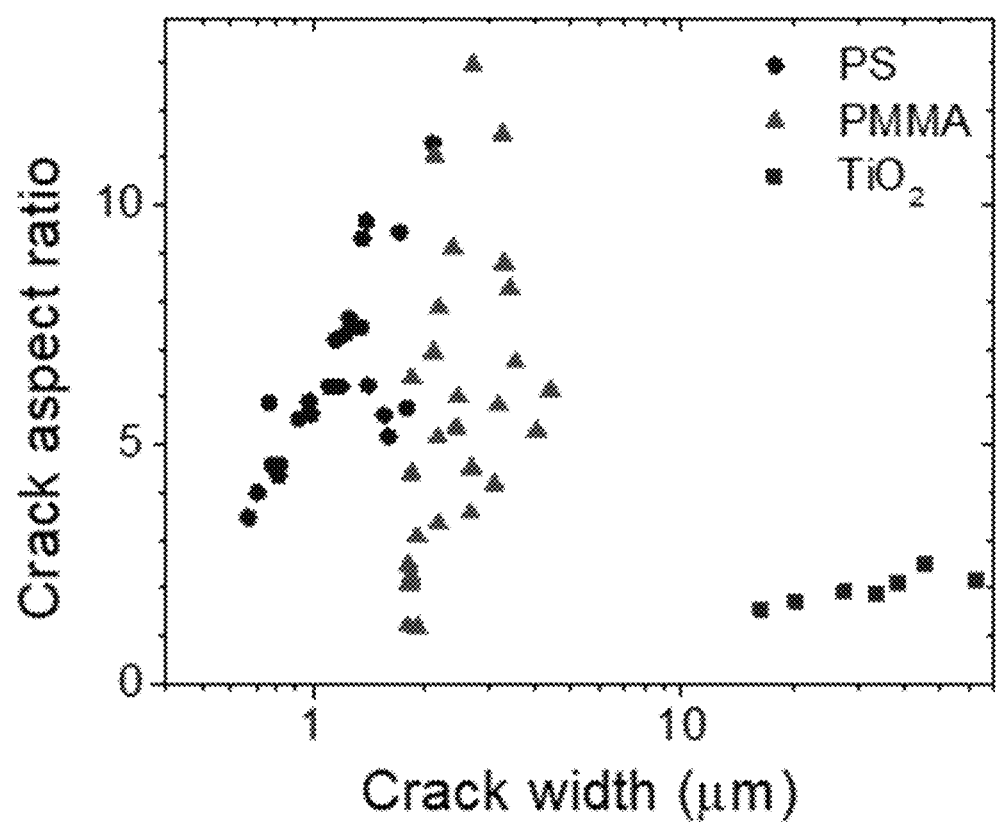
FIG. 9 depicts crack aspect ratio (height/width) as a function of crack width for PS (blue circles), PMMA (green triangles), and $TiO_2$ (red squares).
Figures 10A, 10B, 10C:
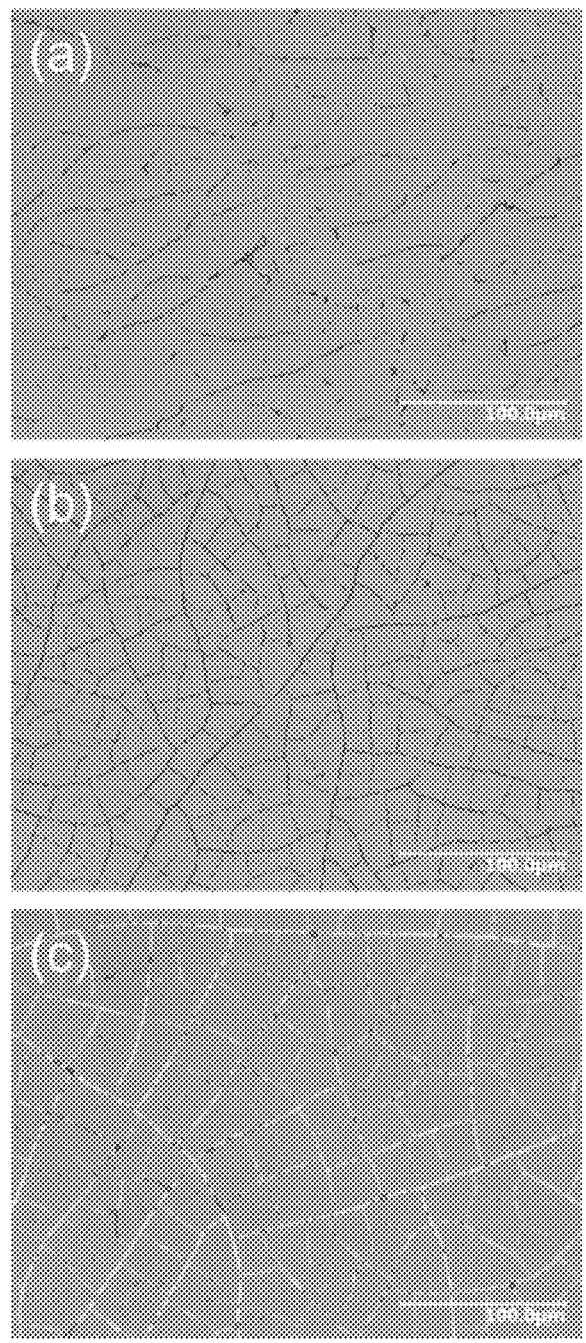
FIGS. 10a, 10b, and 10c depict grids resulting from PS templates with narrow cracks and high aspect ratios, where metal was evaporated (FIG. 10a), evaporated onto a rotating substrate (FIG. 10b), or sputtered (FIG. 10c), showing that reducing directionality of the arriving metal atoms improved wire networking.

The TiO$_2$ templates had cracks with low aspect ratios (height/width), relative to PS and PMMA (FIG. 9). For a given crack width, the PS templates had higher crack aspect ratios. The combination of narrow cracks with high aspect ratios led to broken wires after lift-off when metal was evaporated. On the other hand, when metal was evaporated onto a rotating substrate or sputtered, the PS cracks became more completely 'filled' with metal (FIG. 10). This reduced the number of broken wires and greatly enhanced conductivity. This same effect was observed on switching from stationary evaporation to evaporation onto a rotating substrate, sputtering, or electroplating, where reducing directionality of the arriving metal atoms improved PS's pattern transfer fidelity.

Metal Thickness is Constrained

Figure 11A:
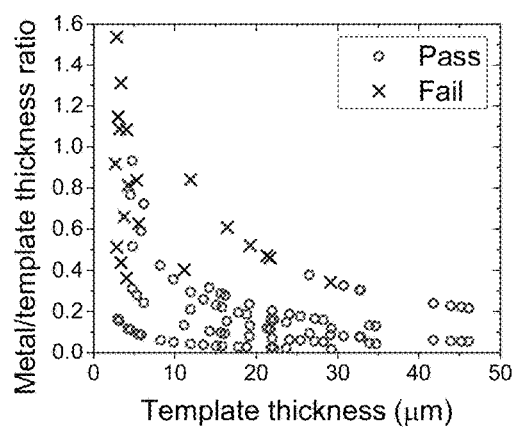
FIG. 11 depicts metal/template thickness ratio as a function of template thickness that led to successful lift-off ("Pass;" green circles) or failed lift-off ("Fail;" red X's) for PMMA (FIG. 11a) and PS (FIG. 11b).
Figure 11B:
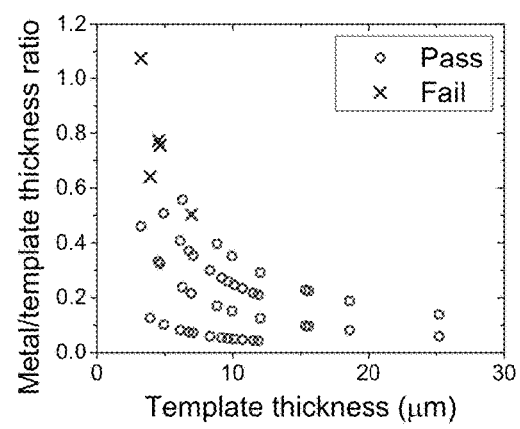
Figure 12:
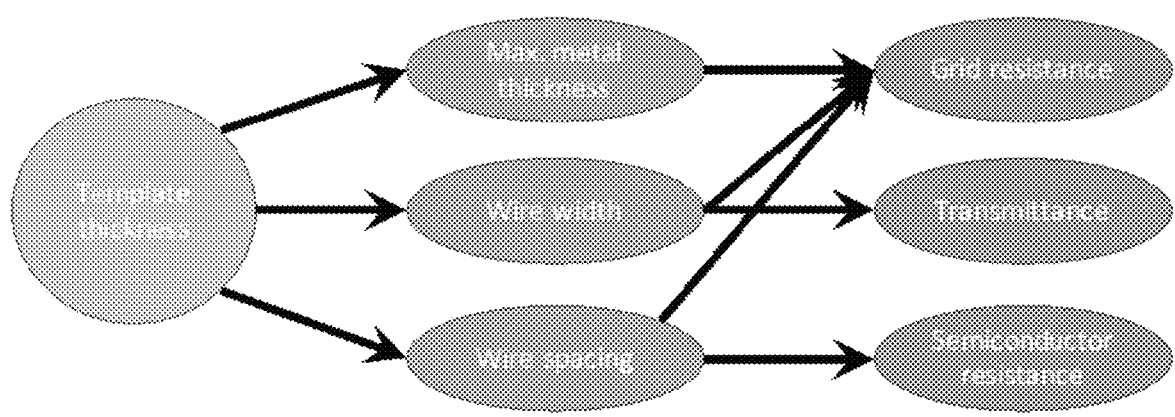
FIG. 12 is a schematic illustrating how the extra constraint on metal thickness alters the fundamental limits of CFL transparent conduction performance.

For CFL to be successful, the deposited metal must be thinner than the crack template, otherwise lift-off can fail through grid delamination, incomplete lift-off or metal flagging. The former leads to holes in the grid networks and high sheet resistance, while the latter two behaviors reduce transmittance. To explore the practical limits of this constraint, the maximum metal thickness at which lift-off is successful was examined for PMMA and PS templates of varied thicknesses (the TiO$_2$ templates were too thick). In spite of the noise and non-reproducibility associated with measuring lift-off failure, the maximum metal thickness/template thickness ratio was consistently ⅓(FIG. 11). These measurements set a limit to how conductive CFL grids can ultimately be. Finally, the extra constraint's effect on the transmittance/sheet resistance/wire spacing tradeoff is illustrated schematically in FIG. 12.

CFL for Solar Cells

The data collected in this study were used to predict transparent conduction performance in solar cells. Traditional transparent conduction figures of merit are not informative for metal grids because they are nonuniform,[3] making more involved calculations necessary. Linear regression was used to correlate crack spacing with transmittance (FIG. 4). Next, grid sheet resistance and transmittance were correlated for each material by assuming the grids had an idealized square shape, such that:

$$T = \left(1 - \frac{(\rho/h_{metal}) \cdot C}{R_{sh,grid}}\right)^2 \qquad \text{Equation (3)}$$

Figure 13:
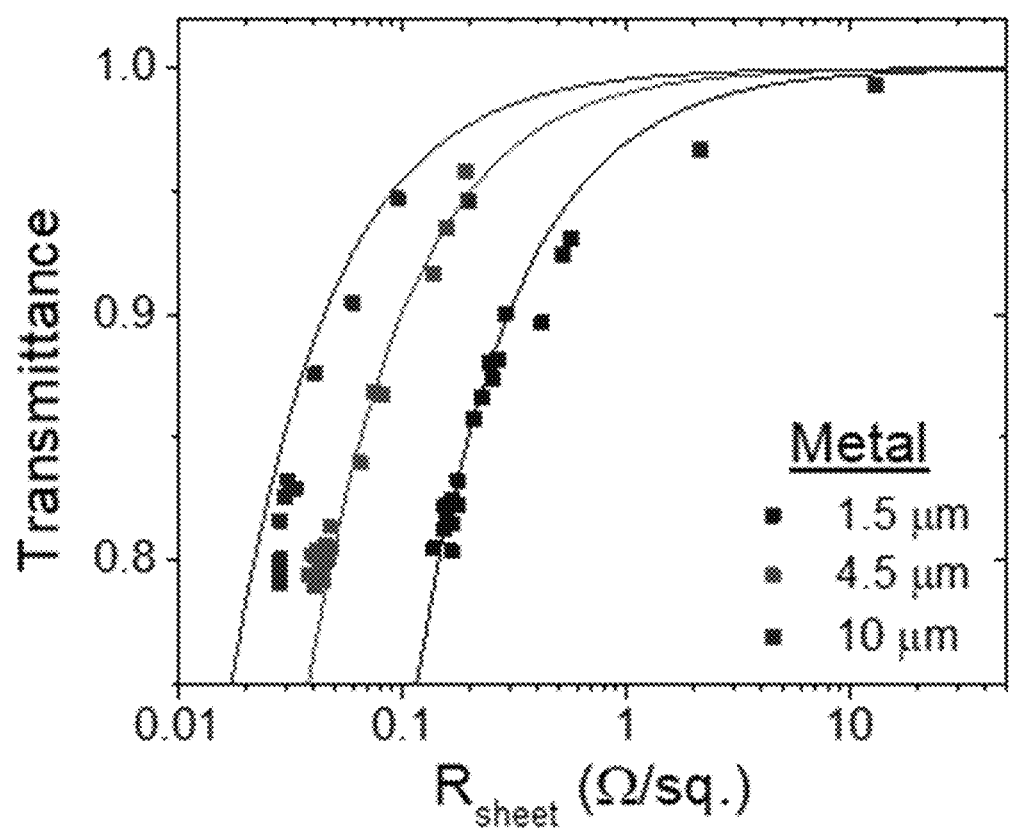
FIG. 13 depicts transmittance (450-890 nm) as a function of grid sheet resistance for metal thicknesses of 1.5, 4.5 and 10 µm (blue, green and red data) for $TiO_2$ templates. Lines are calculated for each metal thickness from eq. 3.
Figure 14:
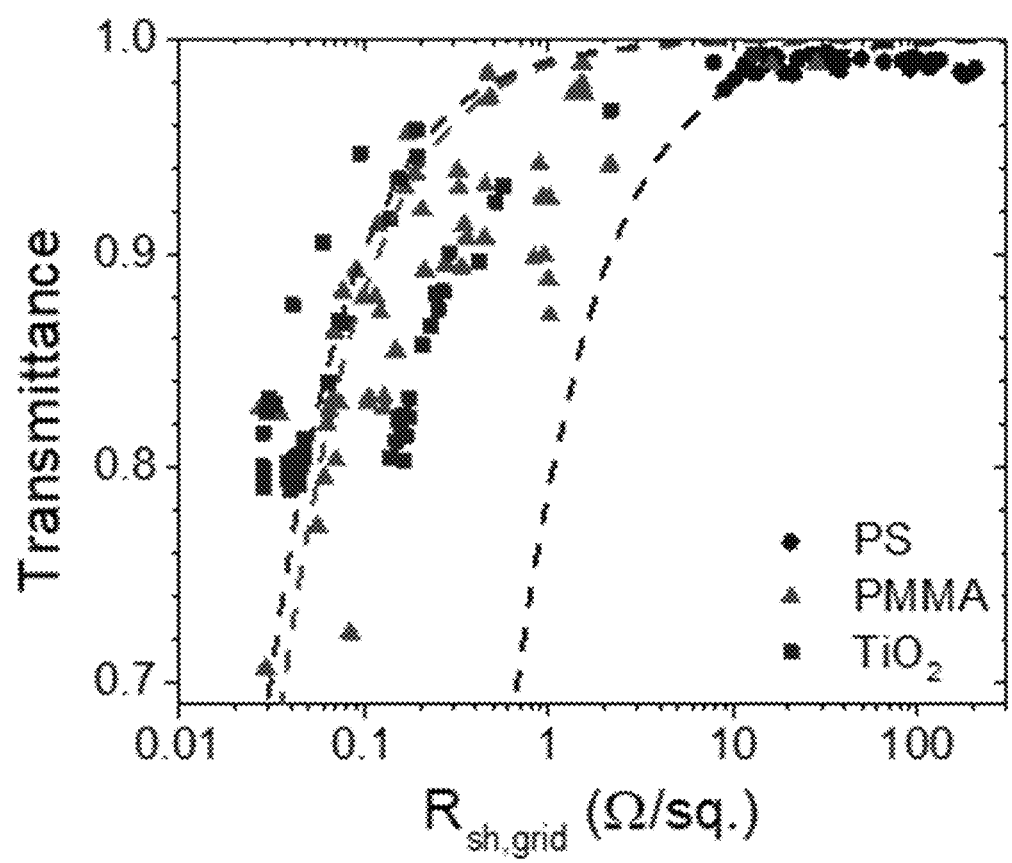
FIG. 14 depicts transmittance (450-890 nm) as a function of grid sheet resistance for PS (blue circles), PMMA (green triangles) and $TiO_2$ (red squares) and their fits for 1.5 µm (PS; blue line), 4.5 µm (PMMA; green line) and 4.5 µm ($TiO_2$; red line) metal thicknesses.

Here, T is transmittance, p is metal resistivity (1.68·10$^{-6}$ Ω·cm), hmetai is metal thickness, C is a constant that was fit to the data to account for the actual grid geometry (1.36 for TiO$_2$, 1.62 for PMMA, 9.87 for PS), and $R_{sh}$,grid is grid sheet resistance. For each material, the C constants were first fit to multiple metal thickness datasets simultaneously (FIG. 13). A metal thickness was then chosen for each material such that a single function was used for all of the data (FIG. 14). While the CFL grid data were imperfectly fit by the ideal square equations, they nevertheless provided the appropriate dependencies for modeling transparent conduction tradeoffs. Next, the procedure to calculate resistive power loss density for lateral current transport through a semiconductor with given sheet resistance ($R_{sh}$,semic) and short-circuit current density ($J_{SC}$=40 mA/cm$^2$) at a given wire spacing for an idealized square grid shape was followed. The semiconductor would commonly be a highly doped emitter, contacting layer or TCO. The same procedure was followed for a grating-shaped grid to model a baseline screen-printed grid. Resistive power loss density for lateral current transport through the metal grid was taken as:

$$P_{loss,Rgrid} = \frac{R_{sh,grid} \cdot L^2 \cdot J_{SC}^2}{3} \qquad \text{Equation (4)}$$

L is solar cell length. One strength of CFL is that it is etch-free, while a weakness is that it requires extra processing to planarize grids—both of these features make CFL well-suited to front grids on substrate and back grids on superstrate solar cells. Therefore, a low-temperature screen-printed grating was taken as a relevant baseline: A wire width of 50 μm, metal thickness of 12 μm, and metal resistivity of $2.6 \cdot 10^{-6}$ Ω·cm were assumed.[4] Finally, the power loss density due to grid shadowing was roughly estimated:

$$P_{loss,T} = (1-T) \cdot J_{sc} \cdot V_{oc} \cdot FF \qquad \text{Equation (5)}$$

Figures 15A, 15B:
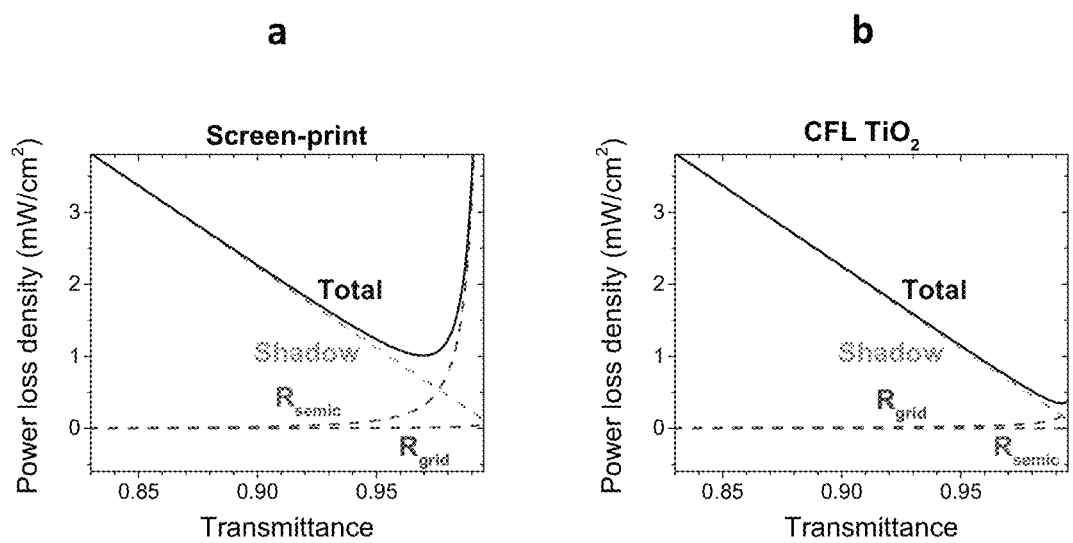
FIG. 15 depicts power loss densities for the screen-printed grating baseline (FIG. 15a) and $TiO_2$-patterned CFL grids (FIG. 15b) due to current shadowing by the grid (orange dashed), resistance in the grid (purple dashed), resistance in the semiconductor (pink dashed) and total (blue; sum of the former 3) as a function of grid transmittance. Cell length was 0.5 cm and semiconductor sheet resistance was 100 Ω/sq.

$V_{OC}$ and FF are the solar cell's open-circuit voltage and fill factor, respectively (700 mV and 80%). Example power loss densities resulting from semiconductor resistance, grid resistance and shadowing are shown for the screen-printed grating baseline and $TiO_2$-patterned CFL grids as a function of grid transmittance in FIG. 15. As can be seen, the CFL grids' narrower wires and spacings exchange negligible grid resistance for negligible semiconductor resistance, leading to lower total power loss density at high transmittances.

Figures 16A, 16B, 16C:
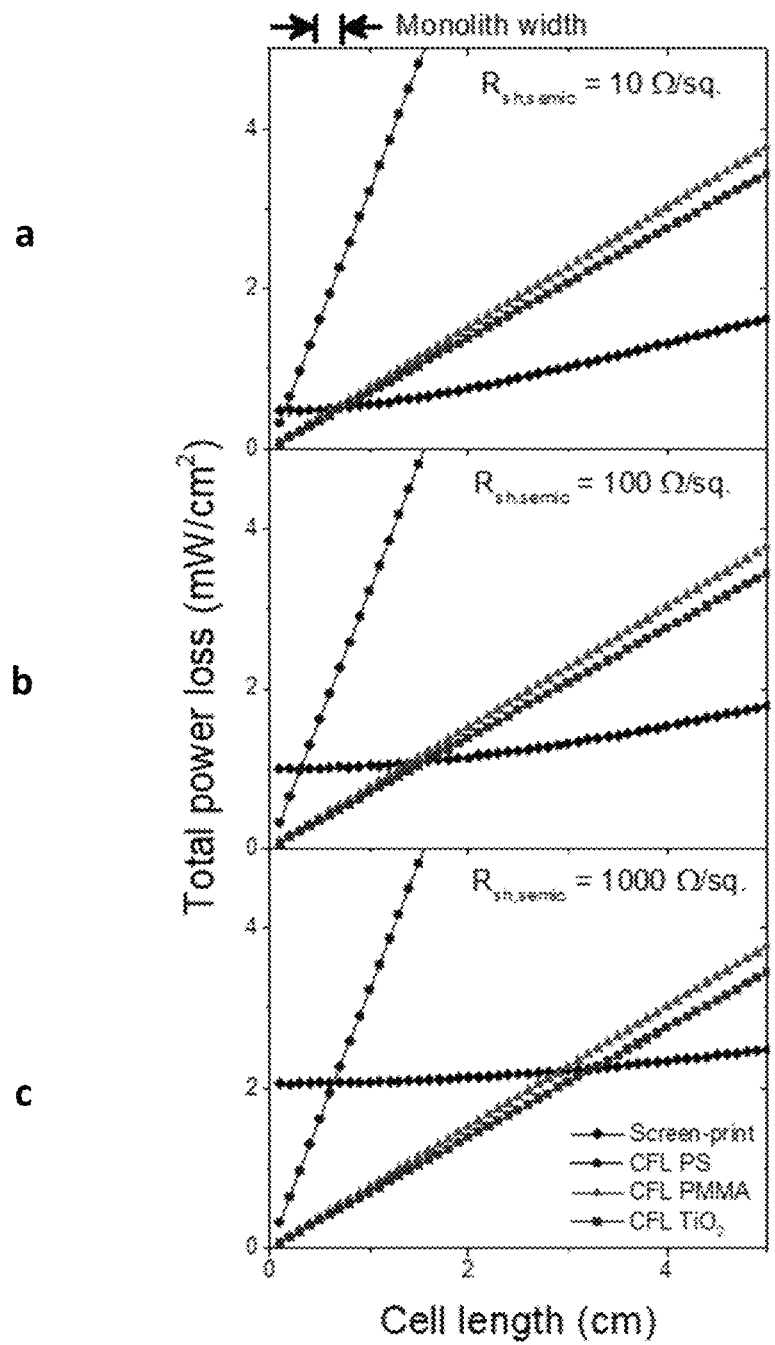
(FIG. 16a), 100 Ω/sq.
(FIG. 16b) and 1000 Ω/sq.
(FIG. 16c).

Next, the total power loss density was minimized with respect to transmittance. Since crack spacing and grid sheet resistance were functions of transmittance for each material (FIGS. 4 and 14), specifying transmittance is equivalent to specifying the transmittance/wire spacing/grid sheet resistance three-way tradeoff. The minimum total power loss density was calculated for each CFL template material and the screen-printed grating baseline as a function of solar cell length at semiconductor sheet resistances of 10, 100 and 1000 Ω/sq. (FIG. 16). These performance estimates show that for narrow solar cells and high semiconductor sheet resistances, CFL grids can beat screen-printing performance. Thus, CFL grids should be useful for monolithically-integrated thin-film modules: CdTe, Cu(In,Ga)(Se,S) and hybrid organic-inorganic perovskites have monolith widths of 0.6 cm, 0.5 cm, and 0.4-0.7 cm, respectively. Moreover, decreasing thin-film solar cells' TCO thicknesses stands to increase current density, while the introduction of CFL grids would recoup the resistive losses. A typical grid-free module has a TCO with 10 Ω/sq., gridded cells/modules permit TCOs with 100 Ω/sq., while buffer layers and the thinnest possible TCOs have 1000 Ω/sq. sheet resistances. Crucially, FIG. 16 demonstrates that CFL can outperform traditional transparent conduction approaches in thin-film PV modules.

Uniform Grids

Figures 19A, 19B, 19C, 19D:
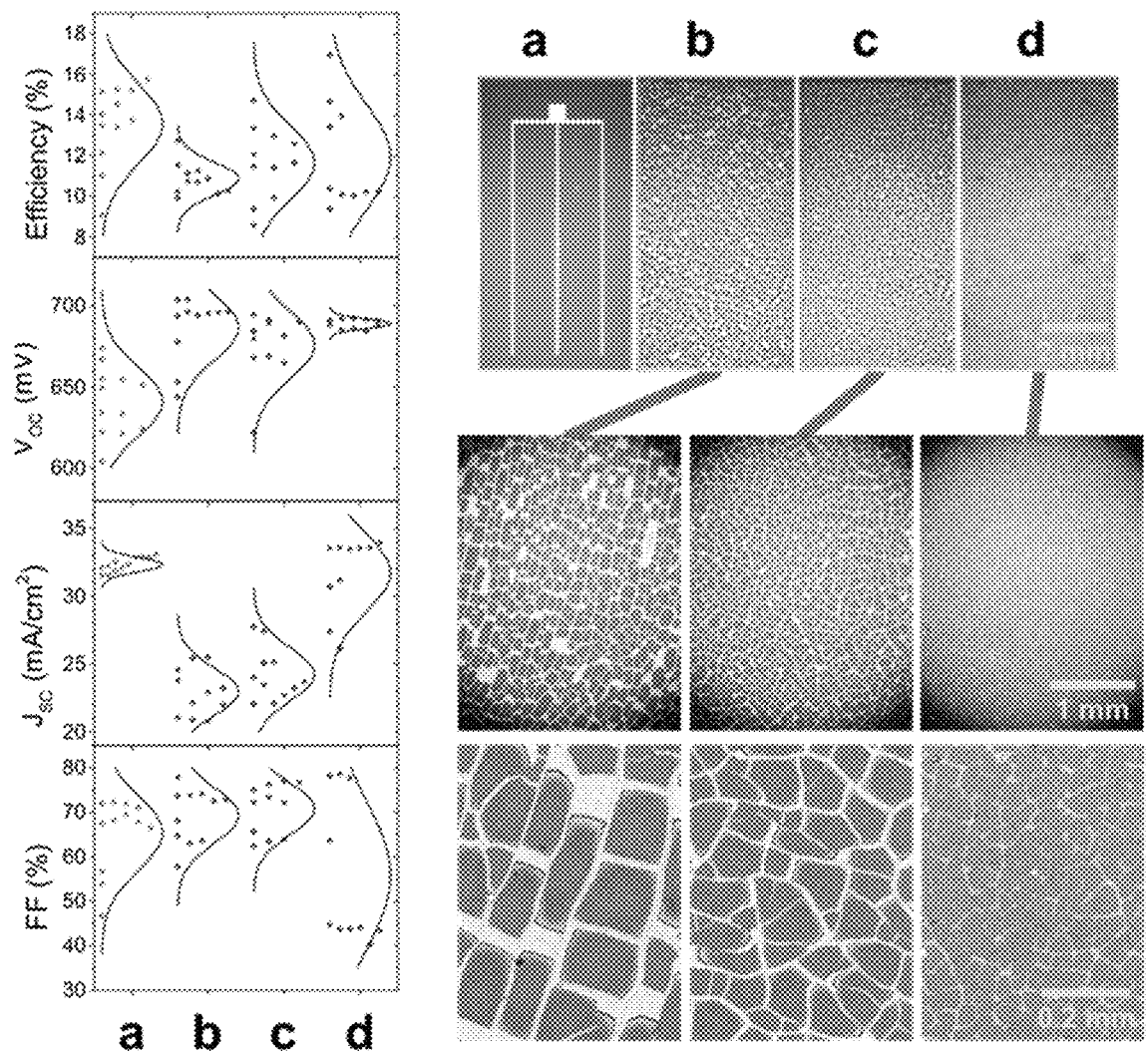
FIG. 19 depicts efficiency, VOC, JSC and FF data for baseline (FIG. 19a) and uniform CFL grids in order of decreasing template thickness (FIG. 19b, FIG. 19c and FIG. 19d), with 30×(2 mm bar scale), 100×(1 mm bar scale) and 500×(0.2 mm bar scale) optical micrographs.

To test the general capabilities of CFL, small area CIGS solar cells were fabricated, and the standard grid fingers patterned by shadow-mask evaporation were replaced with uniform CFL grids. The crack template thickness was systematically decreased to shift the $T/R_{sh}$,grid/wire spacing tradeoff to higher T, higher $R_{sh}$,grid and lower wire spacing (FIG. 19). All of the cells in FIG. 19 were from the same three in ×3 in sample, so a small Ga/(Ga+In) composition gradient shifted the band gap, causing some incidental open-circuit voltage (VOC) variation. On the other hand, the trends in short-circuit current density (JSC) and fill factor (FF) are clearly related to the grids: The T of sample b was too low, which greatly reduced JSC and efficiency relative to the baseline (sample a). Sample d reached similar T and JSC as the baseline, but its grid resistance began to decrease the FF, a result of its narrow wires and holes in the grid network. The latter was a result of operating near the threshold where lift-off of the 3 μm Cu began to fail, so it was not possible to increase metal thickness to alleviate the FF loss for sample d. In summary, FIG. 19 shows that for contacting a TCO with $R_{sh}$,TCO~80 Ω/sq. in a 0.42 cm² cell, the CFL $T/R_{sh}$,grid/wire spacing tradeoff led to an unfavorable JSC/FF tradeoff. This may partially explain why previous studies have been unable to demonstrate high efficiencies with CFL grids.

Patterned Grids

Figures 20A, 20B, 20C, 20D, 20E:
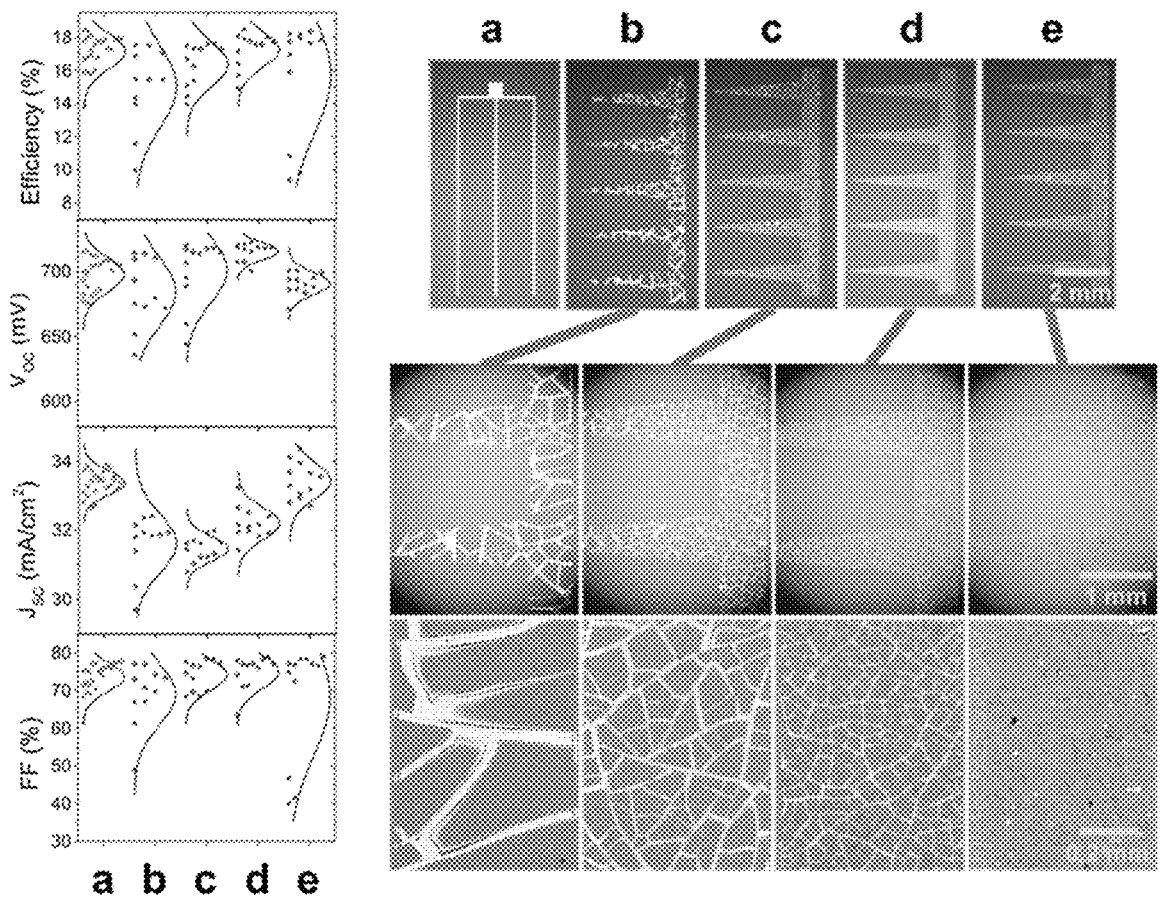
FIG. 20 depicts efficiency, VOC, JSC and FF data for baseline (FIG. 20a) and patterned CFL grids in order of decreasing template thickness (FIG. 20b, FIG. 20c, FIG. 20d and FIG. 20e), with 30×(2 mm bar scale), 100×(1 mm bar scale) and 400×(0.2 mm bar scale) optical micrographs.

In order to break out of the $T/R_{sh}$,grid/wire spacing three-way tradeoff, CFL templates were used in tandem with tapered finger shadow masks (FIG. 18). In this way, the crack-patterned wire spacings in FIG. 19 of 10-50 μm could be shifted to effective values of 1-1.65 mm, the spacing between tapered fingers. The latter values are closer to the wire spacing of the baseline grid (1.4 mm), which is optimized to balance shadowing, TCO and grid losses for the baseline cell dimensions and $R_{sh}$,TCO. Since the fingers in FIG. 18 are so wide, tapering their widths is a desirable way to build in hierarchical TC. FIG. 20 compares the PV performance of a baseline grid with a series of these patterned CFL grids: Sample b had the thickest crack template, leading to lower T/JSC and wire spacings that were too large (poor FF due to grid discontinuities). On the other hand, sample e had high enough T to slightly exceed the baseline JSC, but exhibited poor FF due to grid resistance. The reduced FFs were due to sample e's narrow wires and holes in the grid from metal delamination, which was a result of the metal approaching the thickness of the crack template, reducing pattern-transfer fidelity (like sample d in FIG. 19). While only a small number of samples exhibited the FF drop-off, they are examples of a reproducible phenomenon (not outliers). The JSC/FF tradeoff in FIG. 20 was favorable, leading to a significant number of patterned CFL solar cells that had similar JSC, FF and efficiency to the baselines. The advance in relative performance of the CFL grids from FIGS. 19 to 20 demonstrates the importance of engineering macroscopic nonuniformities that can break through the historical $T/R_{sh}$,grid/wire spacing tradeoffs of CFL-patterned grids, ultimately matching the TC performance of optimized metal grids. Adding anti-reflective coating culminated in a 19.3% efficient solar cell that used patterned CFL grids. This result far exceeds the previous best efficiency for a CFL solar cell, firmly placing it in the high-performance regime.

Modeling Results

Small-Area Cells

Figures 23A, 23B, 23C:
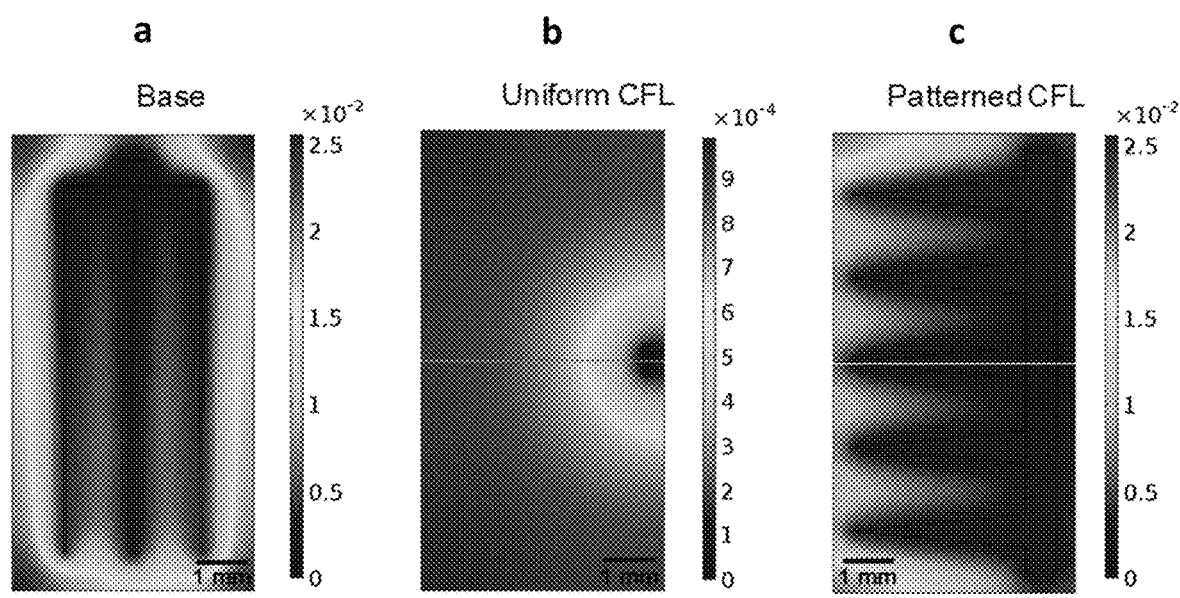
FIG. 23 depicts electric potential contour plot for the (FIG. 23a) baseline grids simulated for 3 μm Al grids (3.77.107 S/m conductivity), (FIG. 23b) uniform CFL grids and (FIG. 23c) patterned CFL grids, each with $R_{sh}$,grid=8.84.10-2 Ω/sq. $R_{sh}$,TCO=80 Ω/sq. and 39.6 mA/cm² were used and the left and right plots have the same contour scale.
Figures 24A, 24B, 24C, 24D, 24E, 24F:
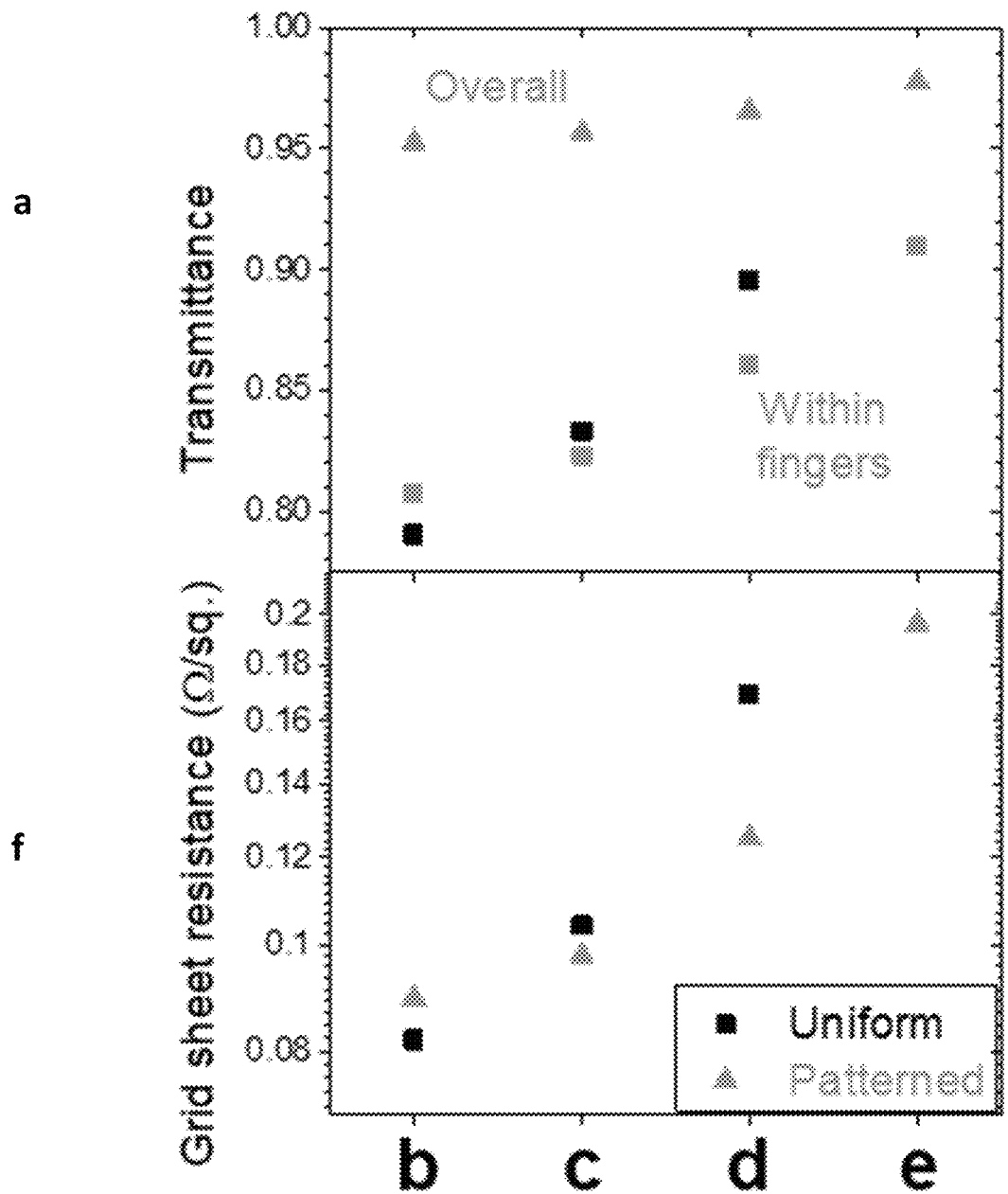
FIG. 24 depicts (FIG. 24a) transmittance and (FIG. 24O grid sheet resistance for the uniform CFL grids in FIG. 19 (black squares) and the patterned CFL grids in FIG. 20 (orange symbols), where crack template thickness was decreased from left to right, FIG. 24b, FIG. 24c, FIG. 24d, and FIG. 24e, respectively. The patterned CFL grids' transmittance just within the tapered fingers (squares) and over the entire cell area (triangles) are shown.
Figure 25:
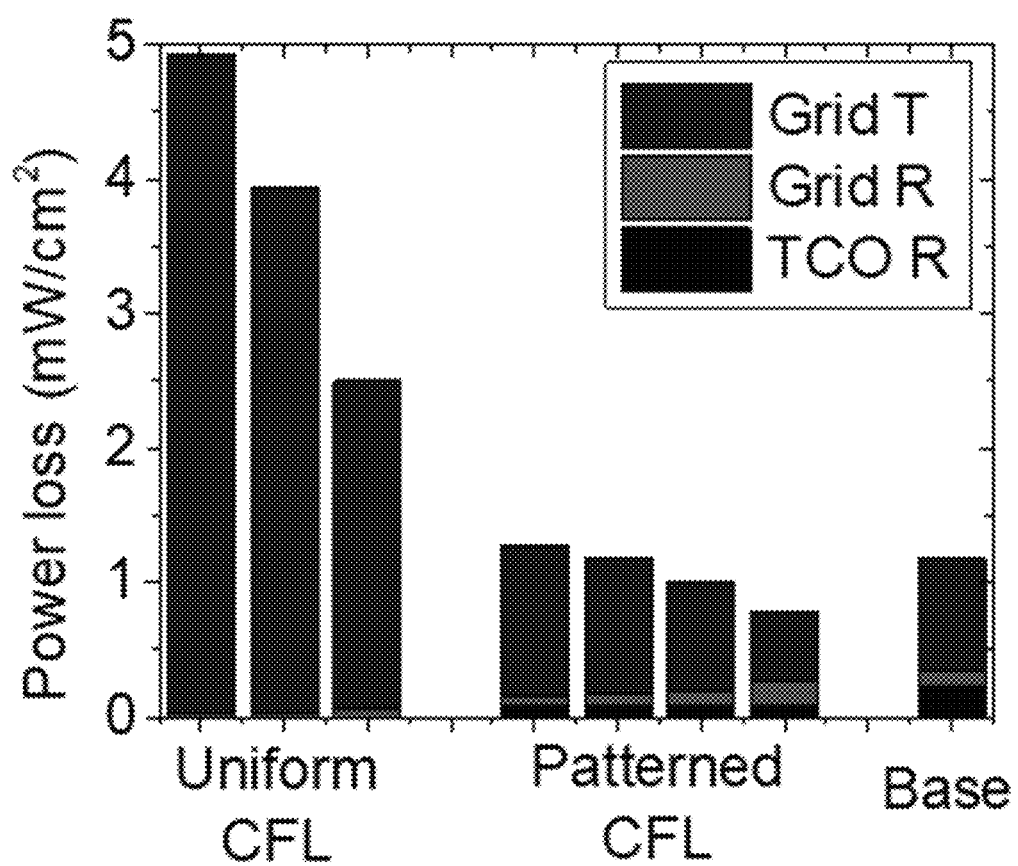
FIG. 25 depicts simulated power loss density for the small area solar cells with uniform CFL, patterned CFL and baseline grids in FIGS. 19 and 20.

FEM electrical simulations were performed to examine the question of why patterned CFL grids were superior to their uniform counterparts. Resistance in the TCO and grid were simulated for the baseline, uniform CFL and patterned CFL grids for JSC=39.6 mA/cm² and $R_{sh}$, TC 0=80 Ω/sq. Example electric potential contour plots for each are in FIG. 23. The power loss density for shadowing was also estimated (current loss in a cell with world record VOC, JSC and FF40). Using the T/Rsh,grid data from the eight samples in FIGS. 19 and 20 (see FIG. 24), lateral current transport in the grid and TCO were simulated. FIG. 25 shows the breakdown of power losses expected for the eight samples. An ideal TC should have well-balanced shadowing, grid and TCO losses. The cells with uniform CFL grids were entirely limited by shadowing losses, so the optimal process had the highest T. In practice, the best possible uniform CFL grids were therefore fabricated as close as possible to lift-off failure to maximize T, and performance was still inferior to the baseline. On the other hand, patterned CFL grids can theoretically exceed the performance of baseline grids. This is because patterned CFL grids lead to current gains at the expense of TCO resistance losses, the latter of which remain almost negligible. That establishes a favorable three-way tradeoff that is more in line with the optimized baseline. Moreover, the shadowing loss for patterned CFL grids is less sensitive to grid T by a factor of 0.245 (the fractional footprint of the tapered finger shadow mask). This reduced grid T sensitivity permits the use of processing conditions that are more robust than the uniform CFL case (further from lift-off failure), while still reaching equivalent performance to the baseline optimum.

Modules

The experimental results and simulations from the previous sections prove that CFL can match and even slightly exceed optimized grid performance in 19.3%-efficient solar cells. However, only one application was examined: 0.42 cm²-area solar cells with Rsh,TCO of 80 Ω/sq. In this section, the results are extended to variable cell areas and Rsh,TCO by calculating thin-film PV module efficiency. Based on the T/$R_{sh}$,grid tradeoffs measured for different crack template materials, previous calculations showed that (uniform) CFL grids can theoretically outperform screen-printed Ag grids in narrow cells (0.5-2 cm wide) with relatively high TCO sheet resistance (≥100 Ω/sq.), making them well-suited to monolithically-interconnected thin-film modules. Extremely thick TCO (1.5 μm) is required to alleviate resistance losses in grid-free CIGS modules, so unlike the small-area cells of the last section, applying grids permits substantial thinning of the TCO and the associated current gains. In spite of this motivation, processes that can fabricate high-performance grids at low cost have been missing—a void which CFL can fill.

Figure 26:
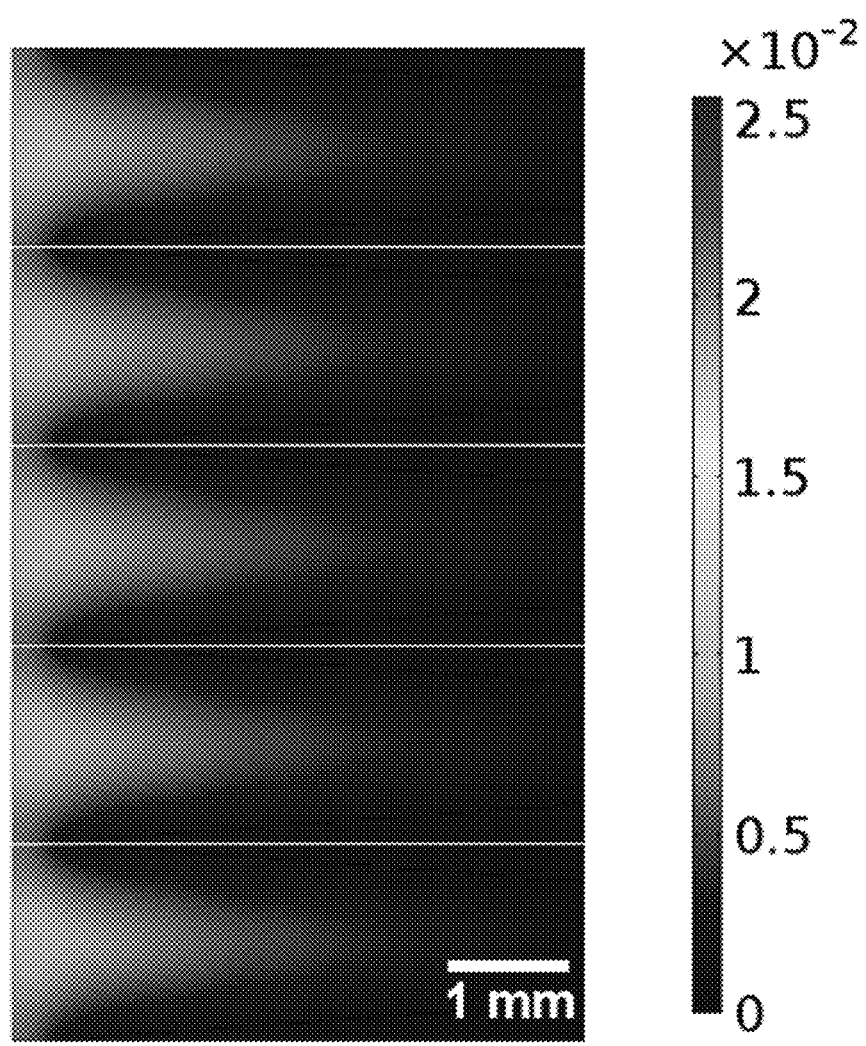
FIG. 26 depicts electric potential contour plot for the patterned CFL grids simulated for a module with 0.5 cm wide monoliths, $R_{sh}$,grid=8.84.10$^{-2}$ Ω/sq., $R_{sh}$, TCO=80 Ω/sq. and 39.6 mA/cm². The monolith is the full width of the figure (with scribed edges on the left and right); the triangles are the tapered fingers. The contour scale is the same left and right.

Using reasonable values for laser-scribed thin-film CIGS modules, efficiency was estimated based on world record small area PV parameters for several cases: grid-free, low temperature screen-printed grids, uniform CFL grids (with PMMA templates used in this work), patterned CFL grids (with tapered fingers similar to those used in the small cells (FIG. 26)) and the best possible grids (with exceedingly favorable T/$R_{sh}$,grid tradeoffs from 100 μm thick and 1 μm wide wires).

Figure 27:
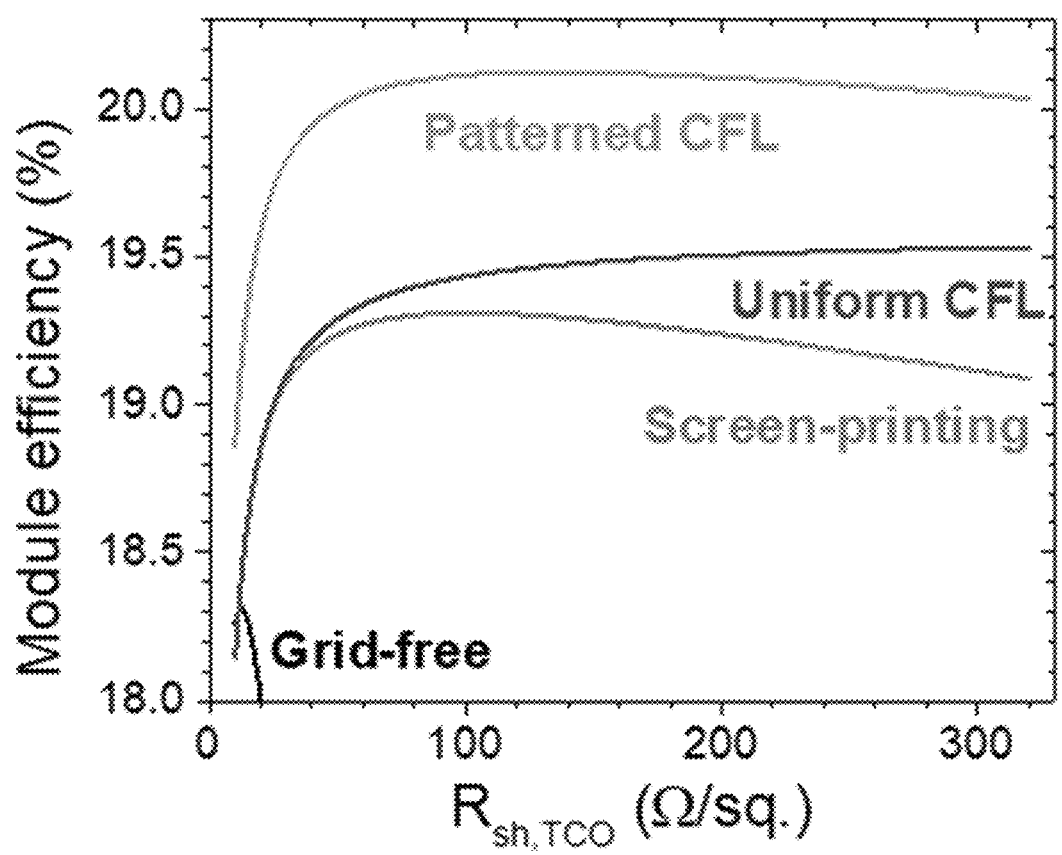
FIG. 27 depicts module efficiency as a function of TCO sheet resistance for the grid-free (black), screen-printing (gray), uniform CFL (green) and patterned CFL (orange) grid cases at a monolith width of 0.5 cm and grid T of 0.95 (where T additionally specified $R_{sh}$,grid and wire spacing trade-off for each grid).
Figures 28A, 28B:
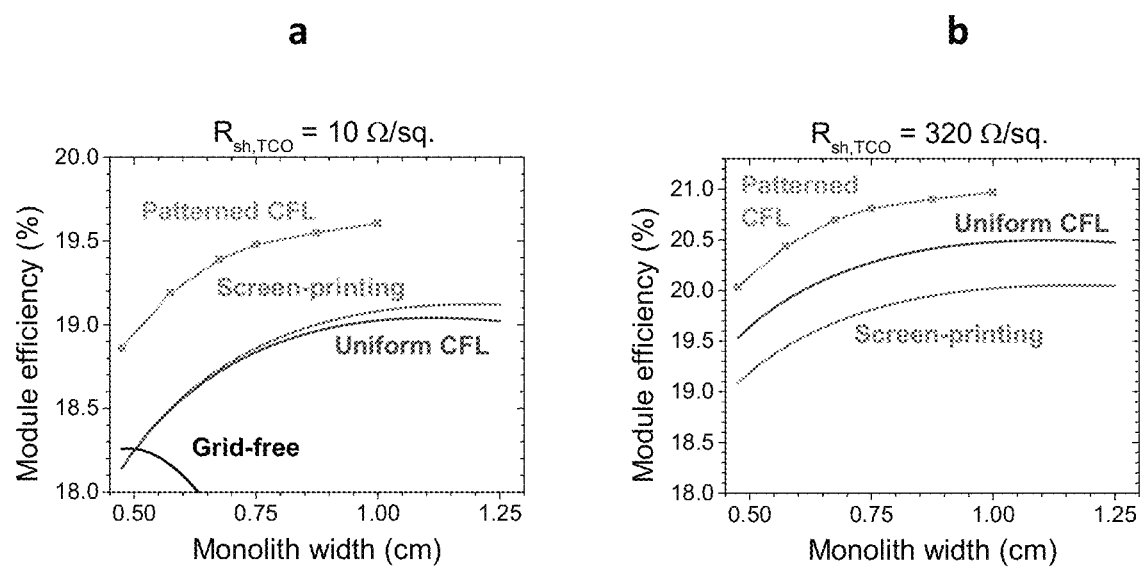
(FIG. 28a) and 320 Ω/sq.
(FIG. 28b).
Figure 29:
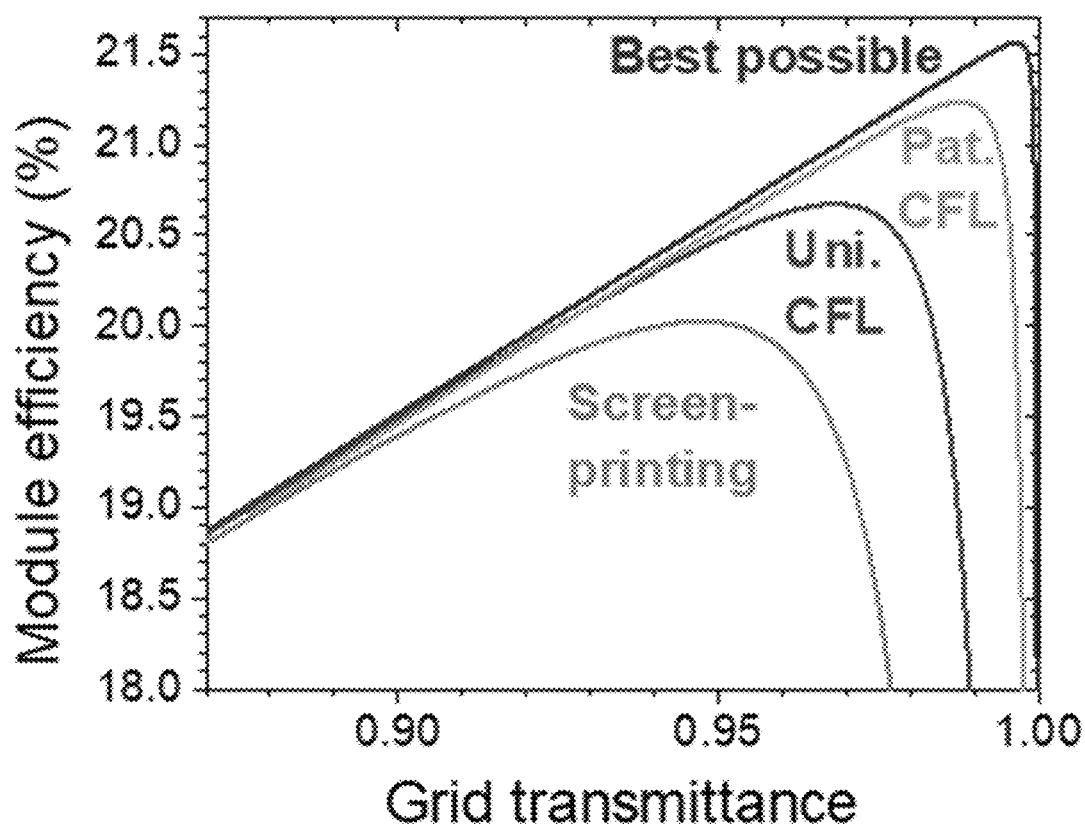
FIG. 29 depicts module efficiency as a function of grid transmittance for the screen-printing (gray), uniform CFL (green), patterned CFL (orange) and best possible (purple) grid cases for wide monoliths (1 cm) and resistive TCO (320 Ω/sq.).
Figures 30A, 30B:
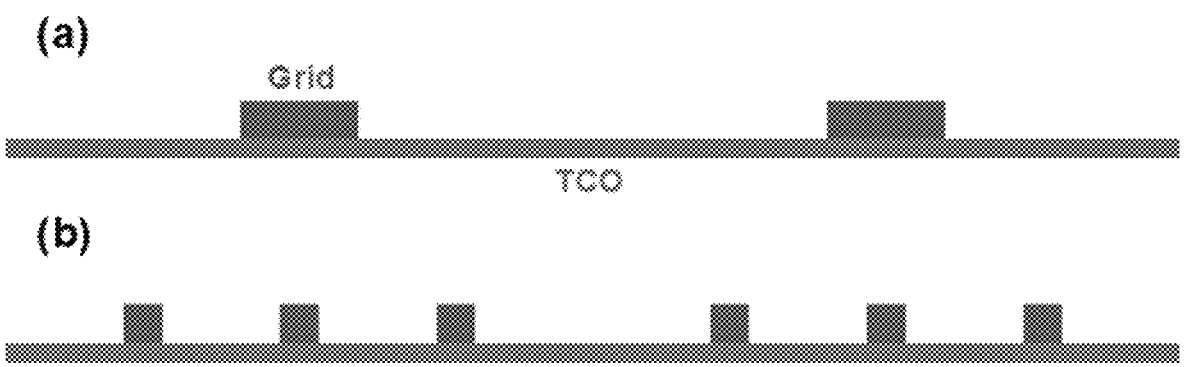
FIG. 30 depicts cross-sectional grid schematic showing why, at constant grid footprint (T) and metal volume ($R_{sh}$, grid), the narrower wires (FIG. 30b) improve performance by reducing TCO resistance, relative to (FIG. 30a).

Module efficiency is plotted as a function of $R_{sh}$,TCO in FIG. 27, showing how grids improve efficiency: They allow thinner TCO to be used, leading to higher JSC at a given total resistance loss. Grids also permit widening of the monoliths (FIG. 28), which reduces the fraction of dead area, as well as the contact resistance and shunting losses. Module efficiency for wide monoliths (1 cm) and high $R_{sh}$, TCO (320 Ω/sq.) are shown as a function of grid T in FIG. 29. Each grid technology has an optimal T: The narrower wire spacings of uniform CFL grids permit higher $R_{sh}$,TCO and better JSC, which allows them to exceed screen-printing efficiency. The best gratings take that trend further, but without incurring any grid resistance penalty. Patterned CFL is similar to the uniform CFL case, but uses macroscopic nonuniformity to hierarchically conduct current from highly transparent regions to highly conductive regions. Relative to a grating, the wide tapered fingers of the patterned CFL design further reduce the TCO conduction burden (at constant T/$R_{sh}$,grid; see schematic in FIG. 30). The principle in FIG. 30 holds unless aspect ratio is constrained, or until large areas and high currents are encountered, which makes busbars or wider wires necessary. The optimal T for uniform CFL is 0.968, which requires extremely thin crack templates and approaches lift-off failure. Crucially, the patterned CFL overall T is scaled to the macro-pattern's footprint of 24.5% ($T_{overall}$=1−((1−$T_{fingers}$) 0.245). This makes patterned CFL's optimal $T_{fingers}$ of 0.901 easier to achieve, since the crack templates employed can be thicker, leading to more robust lift-off.

Figure 31:
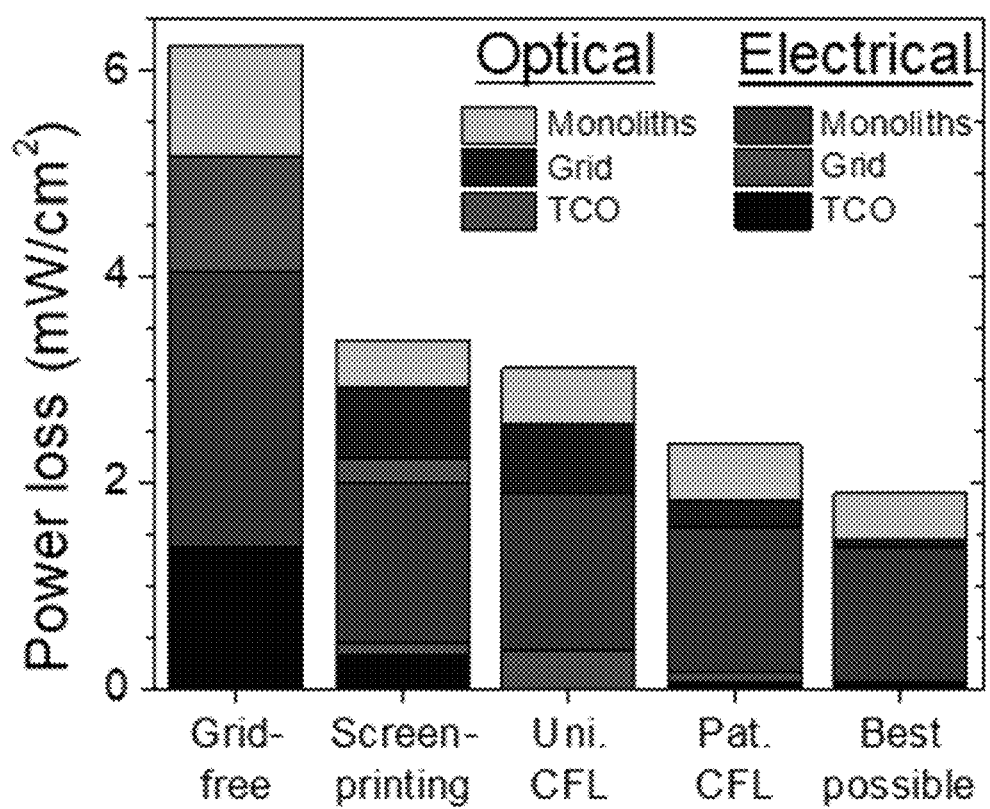
FIG. 31 depicts a breakdown of power losses for the optimal module designs for grid-free, screen-printing, uniform CFL, patterned CFL, and best possible grids (see Table 1): TCO optical (green) and electrical (black), grid shadowing (blue) and electrical (red), and monolith optical (light blue) and electrical (purple).

For each case, module efficiency was simultaneously optimized with respect to $R_{sh}$,TCO, monolith width and grid T (if applicable), where the grid T variable additionally specified Rsh,grid and wire spacing (Table 1). As expected, the grid-free case had a maximum efficiency significantly lower than the small area CIGS record (18.3% versus 23.4%), with optimal Rsh,TCO and monolith width near those used in commercial modules (about 10 Ω/sq. and 0.5 cm, respectively). Low temperature screen-printed grids increased efficiency to 20.5% by permitting higher $R_{sh}$,TCO and wider monoliths. Uniform PMMA CFL grids were predicted to have a similar optimal performance to screen-printing (20.7%). On the other hand, patterned CFL grids enabled substantially better performance (21.2%), almost reaching that of the best possible grids at 21.6%. These results are broken down into various power loss densities in FIG. 31, which shows that grids improve performance by reducing TCO resistance and current losses, while widening monoliths. Screen-printing is inferior to the other grids because its wide wires (70 μm) prevent the total elimination of TCO resistance and current losses. These results demonstrate the importance of grids in modules, and the importance of introducing macroscopic nonuniformity into CFL by patterning (or other means). As previously mentioned, patterned CFL can also take advantage of more robust processing.

TABLE 1

Module efficiency optimized with respect to TCO sheet resistance, monolith width and grid transmittance.

| Module | Optimal eff. (%) | $R_{sh, TCO}$ (Ω/sq.) | Monolith width (cm) | Grid T |
|---|---|---|---|---|
| Grid-free | 18.3 | 13 | 0.45 | — |
| Screen-printing | 20.5 | 57 | 1.1 | 0.97 |
| Uniform CFL | 20.7 | 320 | 0.97 | 0.97 |
| Patterned CFL | 21.2 | 280 | 1.0 | 0.90 |
| Best possible grating | 21.6 | 320 | 1.2 | 0.996 |

Cost

The previous sections showed that CFL matches the performance of baseline grids in small area cells and can lead to modules that are more efficient than screen-printing-based designs. CFL can also be used with electroplating of low-cost metal, which gives another advantage over traditional Ag-based inks. The micrographs in FIG. 17 are a proof-of-concept that used Cu plated onto CIGS device stacks. The grids can be fabricated from start-to-finish in less than 7 min, solidifying CFL's status as a fast and relatively low capital expenditure process.

Durability

A previous study on CFL-patterned metal grids found degradation by electromigration at currents of 52-150 mA for conduction across a channel 0.5 mm long and 0.8 mm wide. Those conditions would correspond to solar cell lengths of 1.8-5.1 cm and a current density of 40 mA/cm² for a given $R_{sh}$,grid. Therefore, CFL cell widths should be less than 1.8 cm to avoid degradation by electromigration. These numbers further indicate that the best application for CFL, thin-film modules, would avoid undesirable degradation modes. The corrosion of Cu grids was checked in this work by measuring grid sheet resistance before and after aging for 1.3 y in ambient air (relative humidity of 10-80% (37% mean), temperature of 22° C., and ambient indoor light). The grids had narrow wires (0.9-2.2 μm), and the $R_{sh}$,grid increased by roughly 10% (Table 2). For comparison, the sheet resistance of Ag nanowires under similar conditions increased by 25% in just 25 d, and Cu nanowires degraded 54% in 25 d. These results suggest that grids formed by CFL are inherently more stable than solution synthesized nanowires, as expected from their wider wires.

TABLE 2

Grid sheet resistance before and after aging 1.3 years in humid air for grids with very narrow wires (0.9-2.2 μm).

| Sample | $R_{sh, grid}$ (Ω/sq.) | |
| --- | --- | --- |
| | Before | After |
| a | 15.8 ± 1.0 | 19.1 ± 4.2 |
| b | 31.2 ± 7.3 | 31.4 ± 11.8 |
| c | 37.6 ± 8.9 | 44.0 ± 21.8 |
| d | 47.1 ± 20.4 | 48.9 ± 21.1 |

A. The Importance of High Transmittance

CFL has a well-defined three-way tradeoff for transmittance (T)/grid sheet resistance ($R_{sh}$,grid)/wire spacing. The routine way to increase T is to use a thinner crack template. However, crack template materials have critical cracking thicknesses, below which no cracks form. This limits how transparent CFL grids can be. Methods for exceeding those limits are valuable for solar cell applications, including but not limited to:

Introduce nonuniformities through macroscopic patterning, or the combination of a CFL template with a larger scale lithographic mask, as shown in the "Macroscopic nonuniformities" manuscript.2 Patterning allows the CFL wire spacing to be shifted to larger values (e.g., from ~25 μm for uniform CFL grids to about 1 mm in patterned CFL grids). Engineering this nonuniformity allows grids' overall T to be increased at the expense of increased semiconductor resistance, the latter of which can still be made negligible for a given semiconductor sheet resistance ($R_{sh}$,semic) and cell width. The pattern is designed to hierarchically conduct current from regions with higher T/$R_{sh}$,grid/wire spacing to regions with lower T/$R_{sh}$,grid/wire spacing. Relative to typical shadow-mask patterned grid fingers, CFL fingers are made wider, reducing semiconductor resistance while keeping T/$R_{sh}$,grid constant. In contrast to uniform CFL, which requires the highest T possible (and therefore the thinnest crack template), patterning CFL permits the use of thicker crack templates, which have more reproducible and uniform lift-off, to be used in high efficiency solar cells.

Figures 32A, 32B, 32C, 32D:
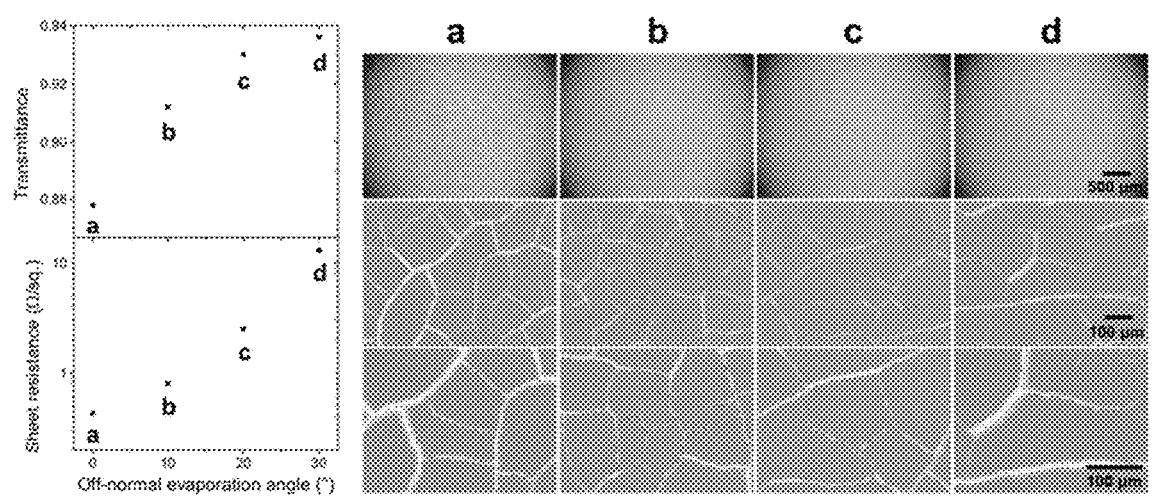
FIG. 32 depicts transmittance, sheet resistance and optical micrographs of final CFL grids formed by evaporation (FIG. 32a) normal to the substrate and off-normal by (FIG. 32b) 10°, (FIG. 32c) 20°, and (FIG. 32d) 30°.

Alter the arriving angle(s) of the deposited metal. This changes how much the cracks are self-shadowed by the crack template. For instance, when the arrival angle of evaporated metal atoms is changed from normal to the substrate, to off-normal by 10°, 20°, and 30°, the final grid's T is increased at the expense of $R_{sh}$,grid (and the slight expense of semiconductor resistance), as shown in FIG. 32. This technique can be used to hierarchically conduct current—for instance, sample d in FIG. 32 conducts well in the left-right direction, but poorly in the top-down direction. Consequently, the sample has greater T than a grid that conducts well in two dimensions.

Figures 33A, 33B, 33C, 33D, 33E, 33F:
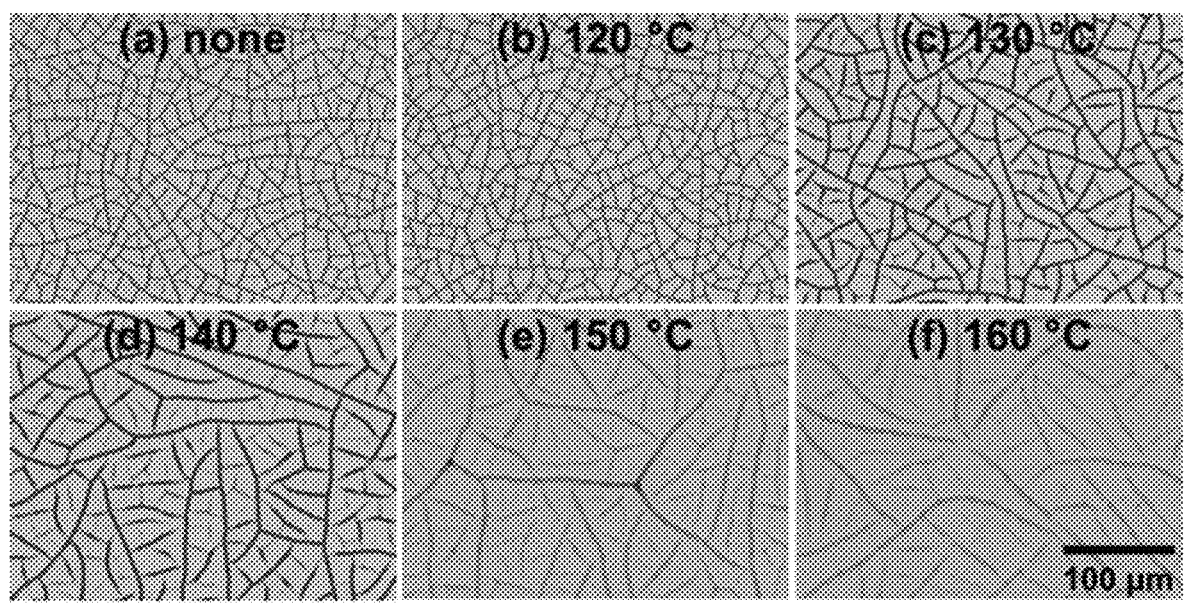
FIG. 33 depicts optical micrographs of a poly(methyl methacrylate) (PMMA) crack template (FIG. 33a), and after it was annealed in air for 5 min at (FIG. 33b) 120° C., (FIG. 33c) 130° C., (FIG. 33d) 140° C., (FIG. 33e) 150° C., and (FIG. 33f) 160° C.
Figures 34A, 34B, 34C:
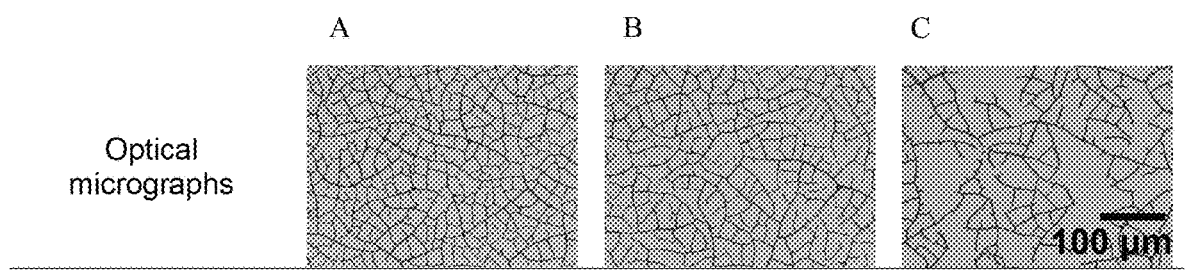
FIG. 34a depicts an optical micrograph of crack templates after pre-baking at 120° C.
FIG. 34b depicts an optical micrograph of crack templates after pre-baking at 130° C.
FIG. 34c depicts an optical micrograph of crack templates after pre-baking at 140° C.

Heat polymer crack templates to make them flow and reduce the crack width. This technique can increase T at the expense of higher $R_{sh}$,grid and slightly higher semiconductor resistance loss (see FIG. 33). The crack template changes in FIG. 33 can be transferred to electroplated grids. To demonstrate, the thinnest possible PMMA crack templates were spun onto GaAs wafers at 10,000 rpm, followed by 'pre-baking' at 120, 130 and 140° C., as depicted in FIG. 34A, FIG. 34B and FIG. 34C, respectively. After $O_2$ plasma-cleaning and etching the oxide in HCl, Ni/Au grids were electroplated. Finally, the PMMA template was lifted off by ultrasonication in tetrahydrofuran. Grid transmittance, wire spacing and width all increased with increasing pre-bake temperature (Table 3). This is how softening the PMMA template to make it flow can increase the final grid's transmittance beyond what is possible by thinning the crack template during deposition.

TABLE 3

Properties of grids that were electroplated through crack templates after pre-baking at different temperatures.

| Pre-bake temp. (° C.) | 120 | 130 | 140 |
| --- | --- | --- | --- |
| Transmittance (from micrographs) | 0.830 | 0.863 | 0.867 |
| Wire spacing (μm) | 5.1 | 5.9 | 9.5 |
| Wire width (μm) | 0.93 | 0.92 | 1.11 |
| Optical micrographs | | | |

Figure 35:
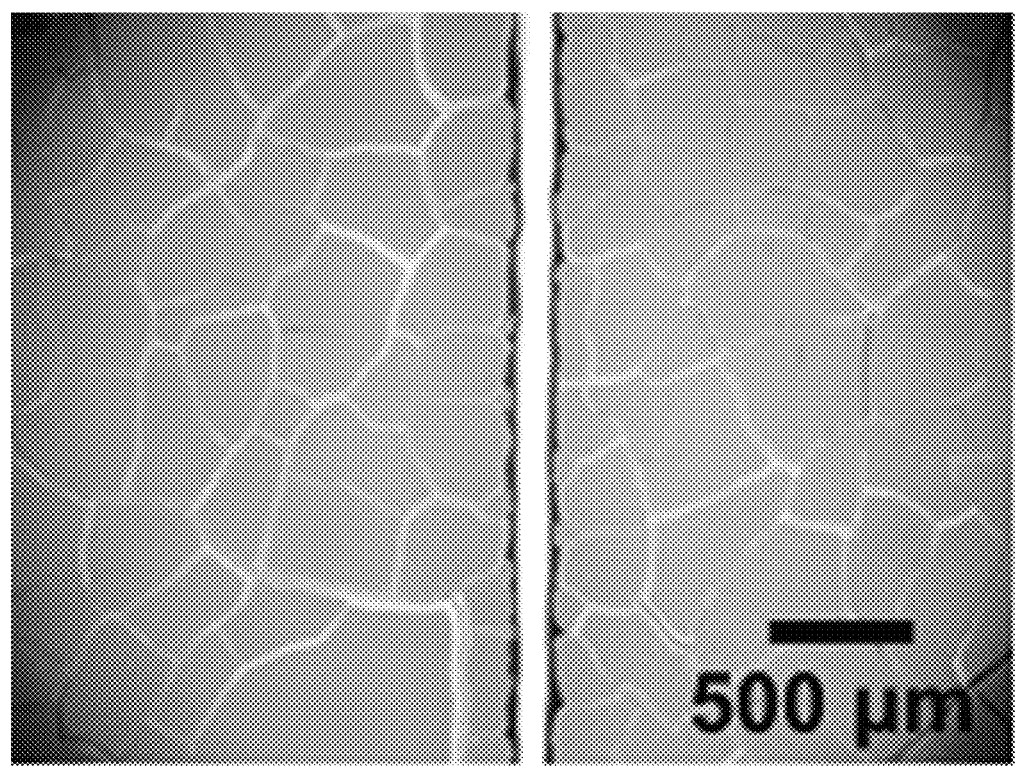
FIG. 35 depicts an optical micrograph showing a busbar incorporated into a CFL grid. The busbar was patterned by mechanically scribing the dried crack template before metal deposition and lift-off.

Incorporate busbar patterns directly into the crack template, especially for wide solar cells (e.g., width greater than 2 cm). This can be performed by mechanically scribing the partially or completely dry template. A scribing stylus made of relatively soft material (e.g., polytetrafluoroethylene or polydimethylsiloxane) can be brought into contact with the substrate/crack template with low force, followed by dragging in a line to remove crack template material without damaging the underlying semiconductor. As shown in FIG. 35, the scribed openings lead to busbars that are fully incorporated into the naturally-formed grid networks. A laser scribe may also be used to ablate the template material. Alternatively, busbars can be patterned by laying wires onto the substrate surface before crack template deposition. During or after template drying, the wires can be pulled upward to remove the overlying and surrounding template material, leaving channels for subsequent metal deposition that will serve as busbars in the final grid.

Use crack template thickness gradients to form a hierarchy of transparent conduction. Current is conducted from regions that had a thinner crack template (higher T/$R_{sh}$,grid) to regions that had a thicker crack template (lower T/$R_{sh}$, grid). Here again, intentional nonuniformities are introduced to increase the overall transmittance, while engineering the losses from $R_{sh}$,grid and semiconductor resistance (wire spacing) to acceptably low levels.

$TiO_2$ reactivity. $TiO_2$ suspensions have poor wetting, and dried $TiO_2$ crack templates have poor adhesion to semiconductor substrates such as Si, GaAs, CdTe, ZnO, $SnO_2$, and $In_2O_3$. A surfactant such as dimethylsulfoxide can be added to drastically improve wetting and final adhesion. However, the resulting enhanced contact between the semiconductor and $TiO_2$ degrades the surface of both ZnO and $SnO_2$, making them less transparent and less conductive. Thus, $TiO_2$ should only be used on surfaces with which it does not react (e.g. Si, $SiO_2$, and $In_2O_3$). Inorganic crack templates are thicker and lead to lower T/$R_{sh}$,grid and wider wire spacing, relative to polymers. If these grid properties are needed on a substrate surface that reacts with $TiO_2$, then a substitute such as $SiO_2$ should be used.

Figures 36A, 36B, 36C, 36D, 36E, 36F:
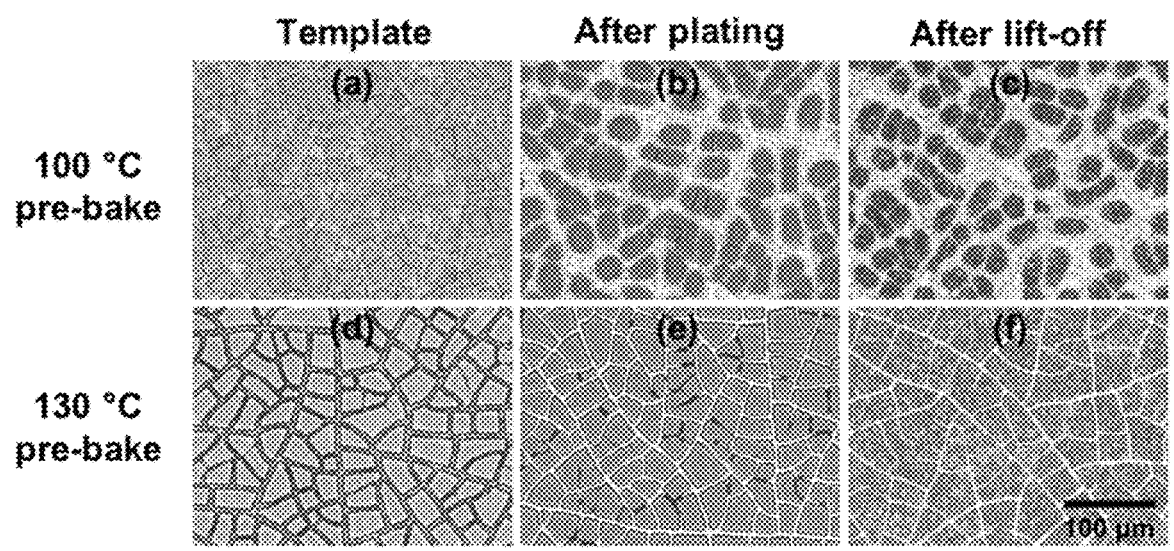
(FIG. 36d) 130° C., those respective samples after plating (FIG. 36b) and (FIG. 36e), and those respective samples after lift-off (FIG. 36c) and (FIG. 36f).

Polymer template adhesion. On drying, crack templates tend to curl upward and peel away from their substrates. This poor adhesion can lead to the undesired delamination or flaking of the template. To rectify this, polymer templates can be "pre-baked" to near their glass transition temperatures. This allows them to soften and relax into more intimate contact with the substrate, and is used to improve adhesion and reduce flaking. It can also be used to reduce deposition of metal between the substrate and template. For instance, for electroplated and sputtered metal, increasing PMMA crack template temperature to near 130° C. greatly improves template adhesion to reduce "underplating" and improve T at the expense of $R_{sh}$,grid (FIG. 36).

Crack template solubility in plating electrolyte. If harder materials are desired (e.g., in order to reach thicker crack templates with wider wires and lower $R_{sh}$,grid) in combination with electroplating, then hard and soft nanoparticles can be mixed. Polymer template materials are more hydrophobic, less water soluble, and can be pre-baked to soften them to improve adhesion, all of which helps them withstand aqueous electroplating. However, polymer templates are thinner than inorganic templates, limiting them to narrower wires and higher $R_{sh}$,grid. On the other hand, inorganic crack templates delaminate in water, but they access wider wires and lower $R_{sh}$,grid. Therefore, mixing inorganic and polymer nanoparticles can form synergistic crack templates that withstand aqueous electroplating at increased template thickness, allowing lower $R_{sh}$,grid values than would otherwise be possible for electroplated CFL grids.

Non-transparent CFL applications in solar cells. The final step of CFL (lift-off) can be foregone, leading to a non-transparent contacting layer that can improve solar cell performance for certain applications. The following are non-exclusive examples:

Diffuse dielectric reflectors. Thick films of nanoparticles such as $SiO_2$, ZnO, $BaSO_4$, $Al_2O_3$ and $TiO_2$ have refractive indices which make them useful as diffuse dielectric reflectors in solar cells. Therefore, $SiO_2$, ZnO, $BaSO_4$, $Al_2O_3$ and $TiO_2$ nanoparticle-based crack templates can remain over most of the back contact area. These can enhance reflection, increasing the effective path length of light in the solar cell to enhance the photocurrent density, while the metal grid maintains good electrical contact and low sheet resistance.

Replace a defective semiconductor/metal interface. Many semiconductor/metal interfaces have defects that result in high surface recombination velocities, killing photovoltaic efficiency. A defective metal back contact can be replaced with a metal-coated CFL template to reduce the defective interface area by ca. tenfold, resulting in ten times less recombination. In cases, the metal/crack template thickness ratio will be high enough so that the metal on top of the crack template and the metal within the cracks will be networked, leading to ultralow $R_{sh}$,grid. This technique can reduce the effect of a defective back metal interface on solar cell efficiency.

Passivate a defective semiconductor surface. Certain materials are both good semiconductor passivators and nanoparticles that can form crack templates. These utilities can be combined by leaving the crack template material on. For instance, $Al_2O_3$ nanoparticle-based crack templates can be paired with CdTe to passivate most of the surface, while still permitting metal contact within the cracks to maintain good electrical contact and low enough $R_{sh}$,grid for back contact application.

Figures 37A, 37B:
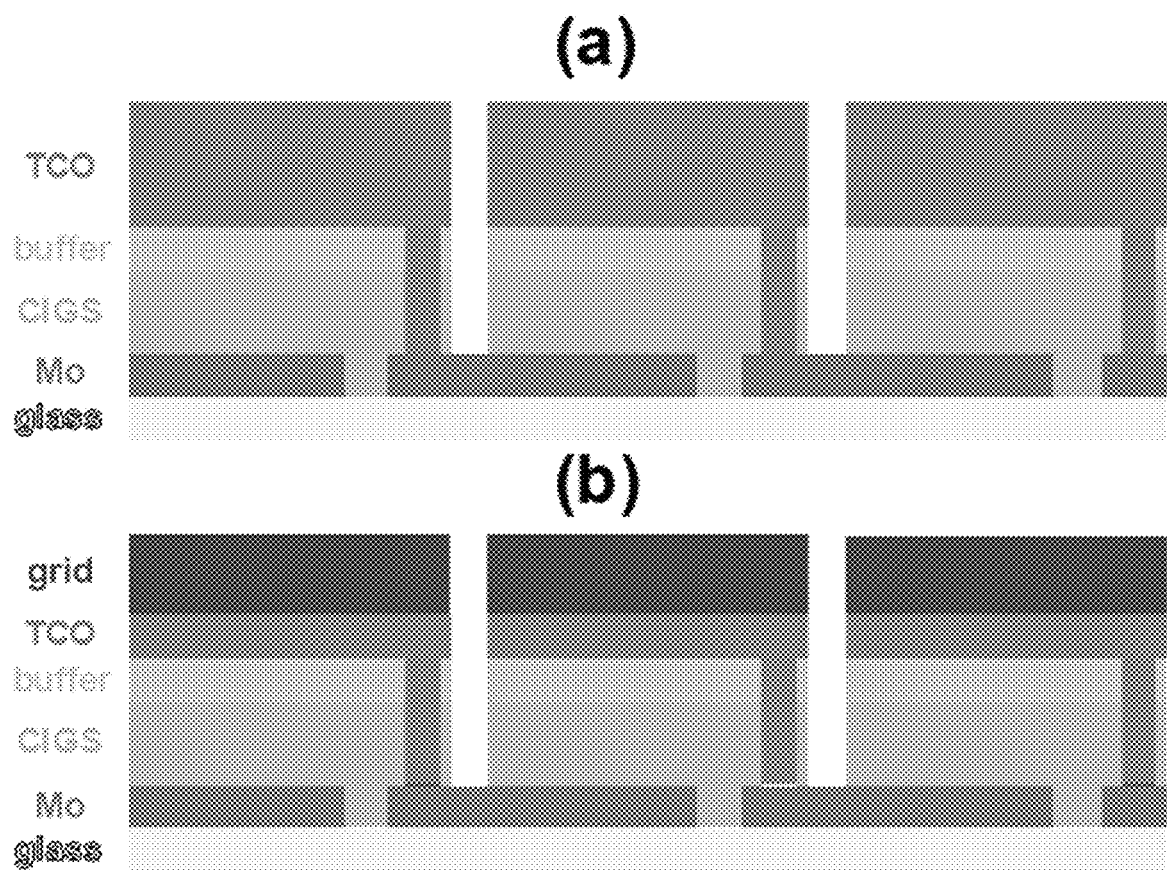
FIG. 37 depicts monolithic integration schematic for a substrate configuration and no insulating ink.
FIG. 37va standard case and FIG. 37b incorporated CFL grids.

Incorporate CFL into monolithically-integrated thin-film PV modules. The following schematics are provided to specifically describe how CFL can be integrated into various substrate and superstrate configurations with various P1, P2 and P3 scribing methodologies, with or without insulating inks:

Substrate configuration without insulating ink. FIG. 37(*a*) shows a monolithic integration scheme common for substrate configuration $Cu(In,Ga)(Se,S)_2$ (CIGS) modules. The P1 scribe comes after the Mo and before the CIGS, the P2 scribe comes after the buffer and before the transparent conductive oxide (TCO), and the P3 scribe comes after the TCO. FIG. 37(*b*) shows that CFL can be incorporated by performing CFL after TCO deposition and before the P3 scribe. The P3 scribe must ablate the CIGS, buffer, TCO and metal grid, while leaving the Mo intact.

Figures 38A, 38B:
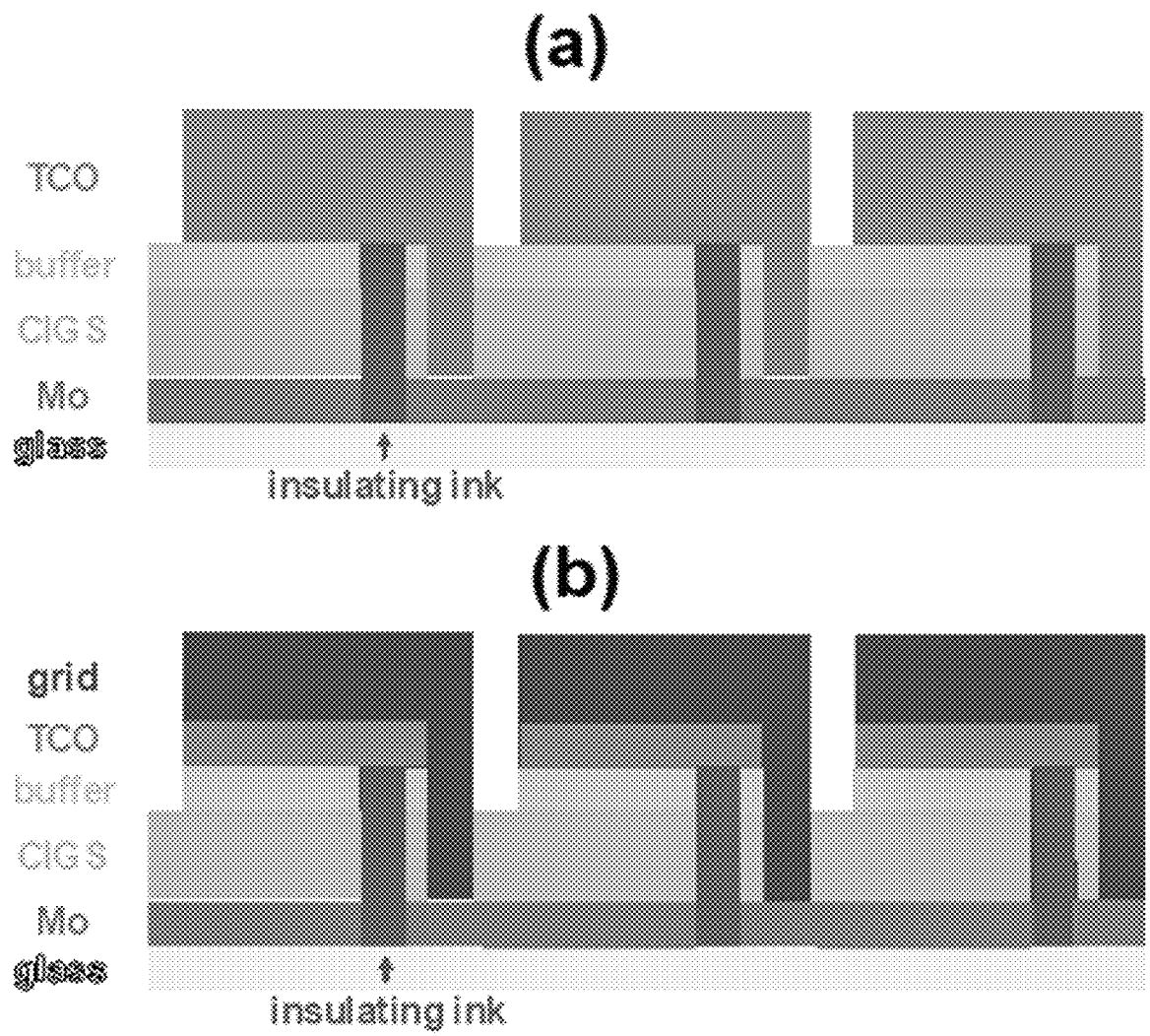
FIGS. 38a and 38b depicts monolithic integration schematic for a substrate configuration with an insulating ink.

Substrate configuration with insulating ink. FIG. 38(*a*) shows a monolithic integration scheme common for substrate configuration CIGS modules that uses insulating ink to reduce the shunting conductance between monoliths. FIG. 38(*b*) shows that CFL can be incorporated by performing CFL after the P2 scribe and before the P3 scribe. The P3 scribe should be optimized to completely ablate the TCO/grid, partially removing the CIGS/buffer or not, while leaving all of the back contact Mo layer intact.

Figures 39A, 39B:
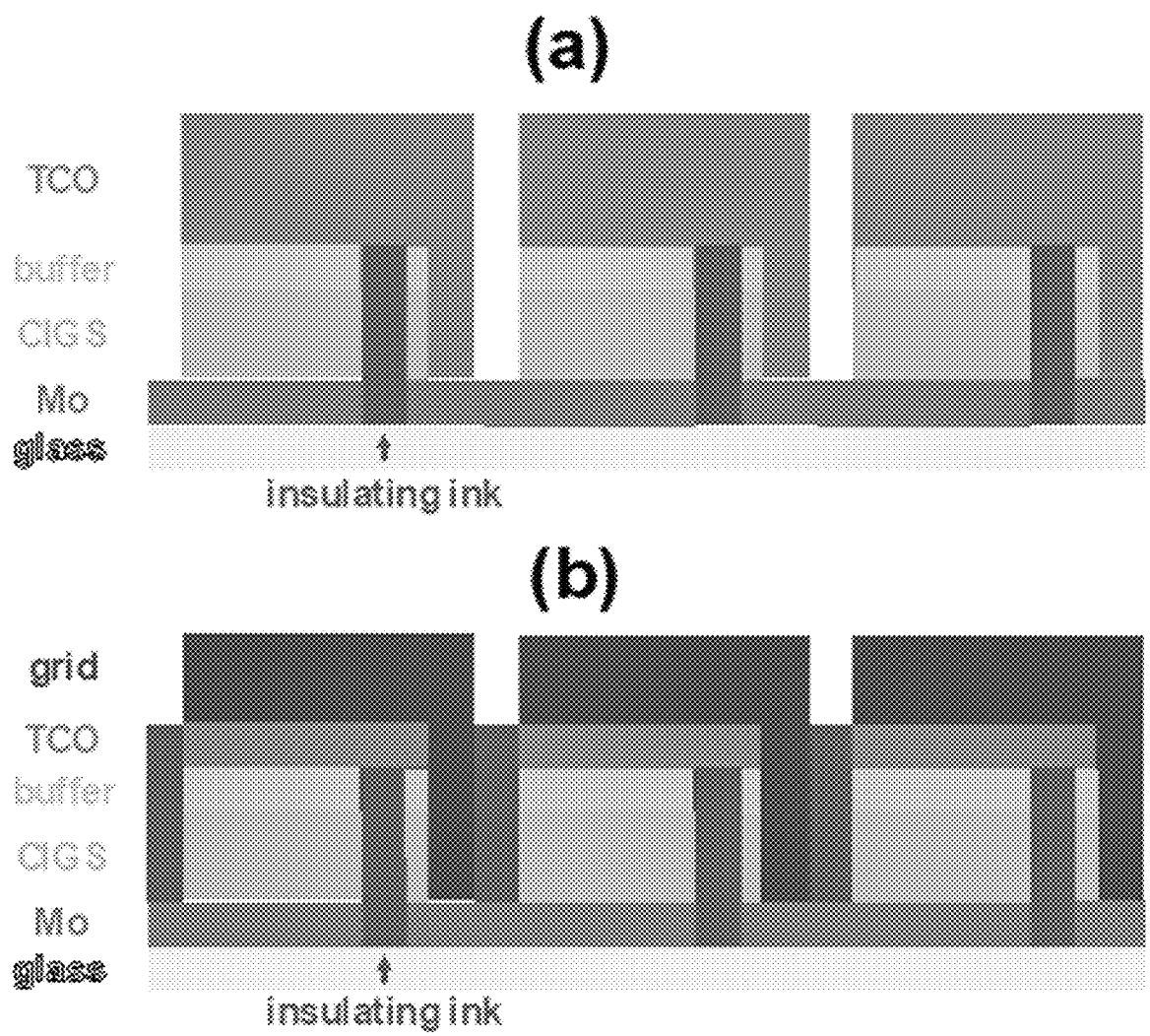
FIGS. 39a and 39b depict monolithic integration schematic for an alternate substrate configuration with an insulating ink.

Alternate substrate configuration with insulating ink. FIG. 39(*a*) shows an alternate monolithic integration scheme for substrate configuration CIGS modules that uses insulating ink to reduce the shunting conductance between monoliths, as well as an extra gap between the TCO and neighbor monolith's CIGS to further reduce shunting and recombination. The latter is a kind of combined P2+P3 scribe. FIG. 39(*b*) shows that CFL can be incorporated by performing the combined P2+P3 scribe, adding a second insulating ink region, followed by CFL and electroplating. The electroplating only occurs on the conductive surface, keeping the monoliths isolated. Otherwise, CFL can be performed after TCO, followed by a P3 scribe that completely ablates the TCO/grid, may partially or fully ablate the CIGS/buffer, but leaves the Mo layer intact.

Figures 40A, 40B, 40C:
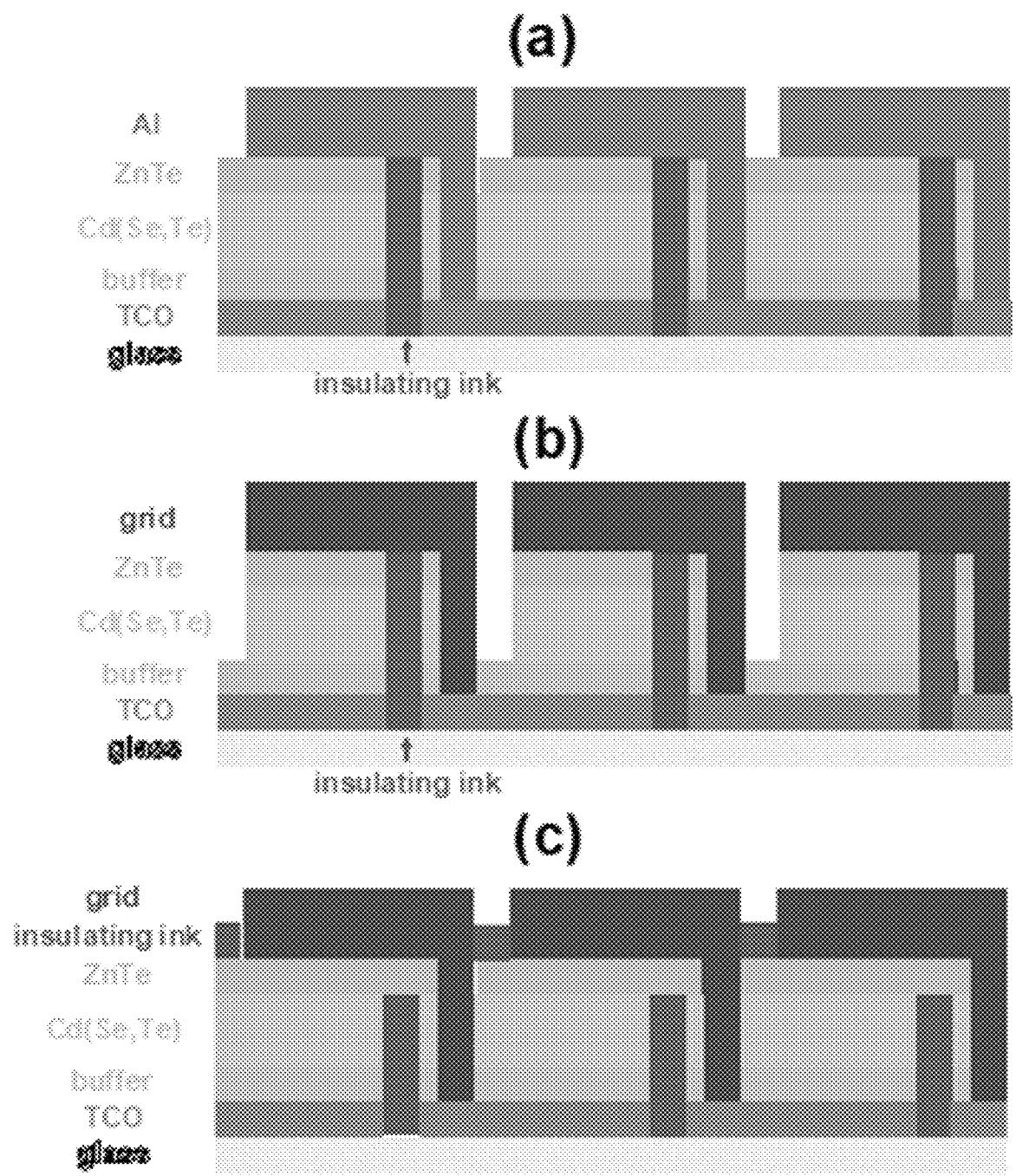
FIGS. 40a, 40b and 40c depict monolithic integration schematic for a superstrate configuration with insulating ink.

Bifacial superstrate configuration with insulating ink. FIG. 40(*a*) shows a monolithic integration scheme common for superstrate configuration CdTe modules. FIG. 40(*b*) shows that CFL can be incorporated by performing CFL with metal sputtering or evaporation after the insulating ink is used to fill the P2 scribe, and before the P3 scribe that completely ablates the metal grid and doped ZnTe contact layer, may partially ablate the Cd(Se,Te) and/or buffer layers, and leaves the TCO layer completely intact. FIG. 40(*c*) shows an alternate scheme for metal electroplating, where the P1 scribe and insulator ink are applied before ZnTe deposition. After ZnTe deposition and thermal activation (which the insulator ink must withstand), the P2 scribe is performed and another region of insulating ink is applied. Finally, CFL is performed with metal electroplating, which occurs across the conductive substrate, but not on the insulating ink.

Figures 41A, 41B, 41C, 41D:
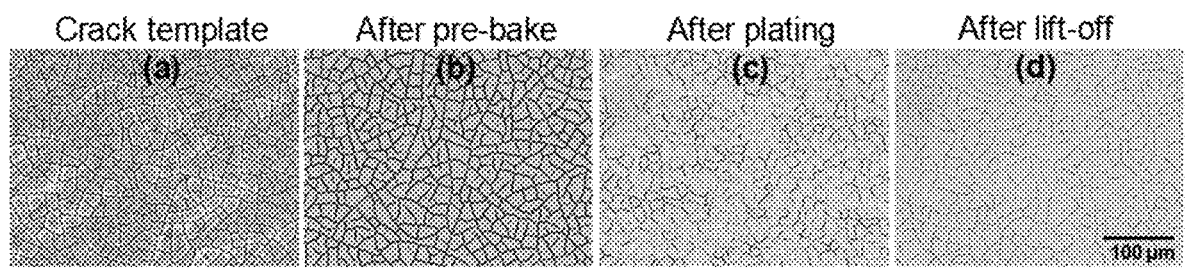
FIGS. 41a, 41b, 41c, and 41d depict CFL demonstration on a GaAs solar cell stack.

Use CFL with III-V solar cells to reduce cost. CFL is an alternative to photolithography that can be used to pattern the electroless/electroplating of metal grids at reduced cost. CFL templates are less expensive than photoresist/developer, and CFL is much faster since it does not require the alignment, exposure and developing steps needed for photolithography. For instance, crack templates were deposited on GaAs solar cell stacks, followed by pre-baking, $O_2$ plasma-cleaning, oxide etching in HCl, electroplating of Ni, electroplating of Au, and lift-off (FIG. 41). III-V emitters are typically highly doped, have low sheet resistances, and small cell widths, making the CFL grids with high T and narrow wire widths in FIG. 41 desirable. The 120° C. pre-bake temperature in FIG. 41 translated to similar open-circuit voltage and fill factor to the photolithography-patterned baseline, although the short-circuit current density was lower (Table 4). To increase current, the pre-bake temperature was increased to 140° C., leading to a lower grid footprint and similar short-circuit current density as the baseline (at the expense of fill factor). These results demonstrate that CFL is a low-cost way to pattern the electroplating of metal grids for III-V solar cells with a JSC/FF tradeoff that is only slightly inferior to photolithography.

TABLE 4

Efficiency, open-circuit voltage, short-circuit current density
and fill factor of GaAs solar cells (0.25 cm² area) with
electroplated grids patterned by photolithography (baseline)
and CFL that used different pre-bake temperatures.

| Sample | Eff. (%) | $V_{OC}$ (mV) | $J_{SC}$ (mA/cm²) | FF (%) |
|---|---|---|---|---|
| Baseline | 18.4 | 1.087 | 19.7 | 86.0 |
| CFL (120° C. pre-bake) | 17.4 | 1.085 | 18.7 | 85.9 |
| CFL (140° C. pre-bake) | 17.4 | 1.074 | 19.8 | 82.0 |

Use CFL to form a transparent back contact for bifacial CdTe modules. The industry-standard sputtered Al back contact can be exchanged for a CFL-patterned grid that has multiple advantages:

TCO back contacts are undesirable for CdTe bifacial applications because they have poor electrical contact with CdTe, typically require high temperature to obtain quality $T/R_{sh}$ tradeoffs, and would require unreasonably thick films to reach the preferred sheet resistance (ca. 0.5 Ω/sq.).

Figure 42:
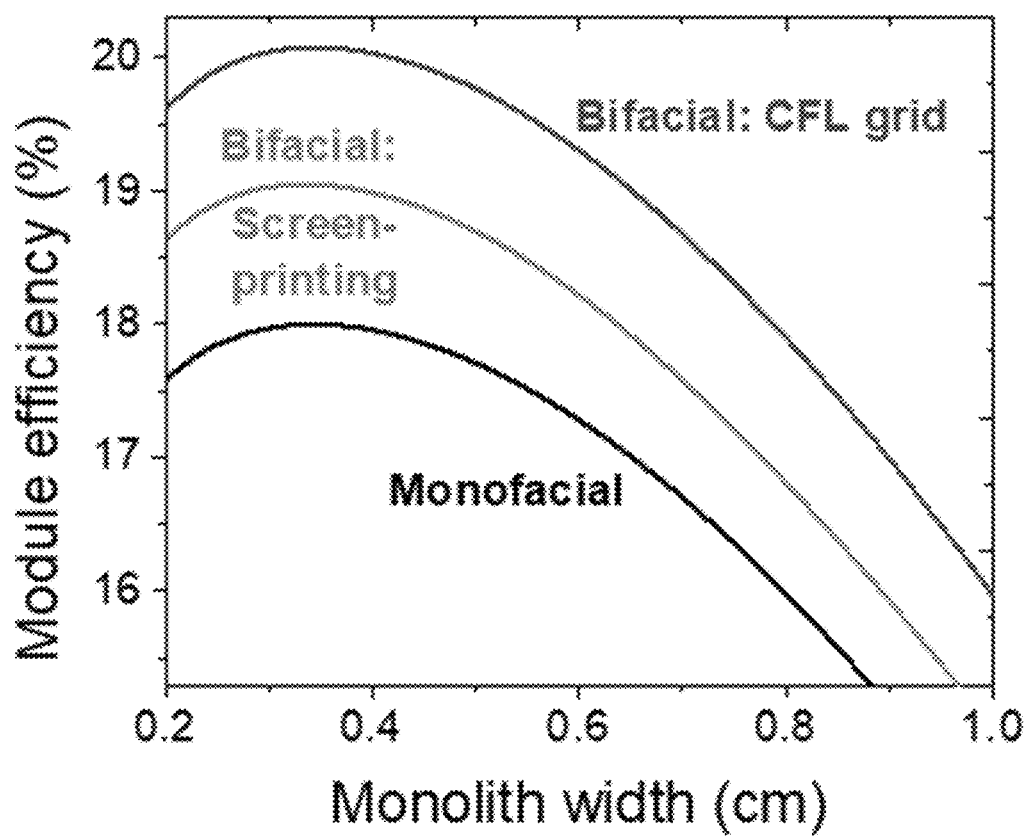
FIG. 42 depicts module efficiency calculated for baseline monofacial CdTe (black; back contact Rsh=0.5 Ω/sq.), bifacial with a screen-printed back grid (gray), and bifacial with a CFL back grid (green). Calculations use a front TCO sheet resistance of 15 Ω/sq., grid T=0.95, back semiconductor sheet resistance of doped ZnTe (780 Ω/sq.), and a bifacial current boost of 10% at T=0.95.

Replacing blanket Al with low-temperature screen-printed Ag is not attractive because Ag is expensive and screen-printing is constrained to wire widths of 50-70 For a CdTe back contact, the industry-standard $R_{sh}$,semic will be that of doped ZnTe (about 780 Ω/sq.). This high semiconductor sheet resistance requires narrowly spaced grid wires to keep semiconductor resistance low, which is difficult for screen-printed grids to achieve at reasonably high grid T (ca. T=0.95). In order to compare CFL grids with screen-printing, module efficiency calculations were performed. A best-case scenario was assumed for bifacial performance, where a back grid with T=0.95 would correspond to a short-circuit current density boost of 10%. FIG. 42 compares a baseline monofacial module with bifacial modules using screen-printed grids (70 μm wide wires that are 21 μm high and have 1.2·10-5 Ω·cm resistivity) and CFL grids (using empirical correlations for $T/R_{sh}$,grid/wire spacing tradeoffs measured for PMMA crack templates). FIG. 42 demonstrates that making CdTe modules bifacial can increase efficiency by 1.1% absolute. However, accessing the full bifacial boost requires a metal grid with narrowly-spaced wires (such as CFL), as opposed to screen-printing. Moreover, CFL can be Ag-free, reducing material cost compared to screen-printing.

Figure 43:
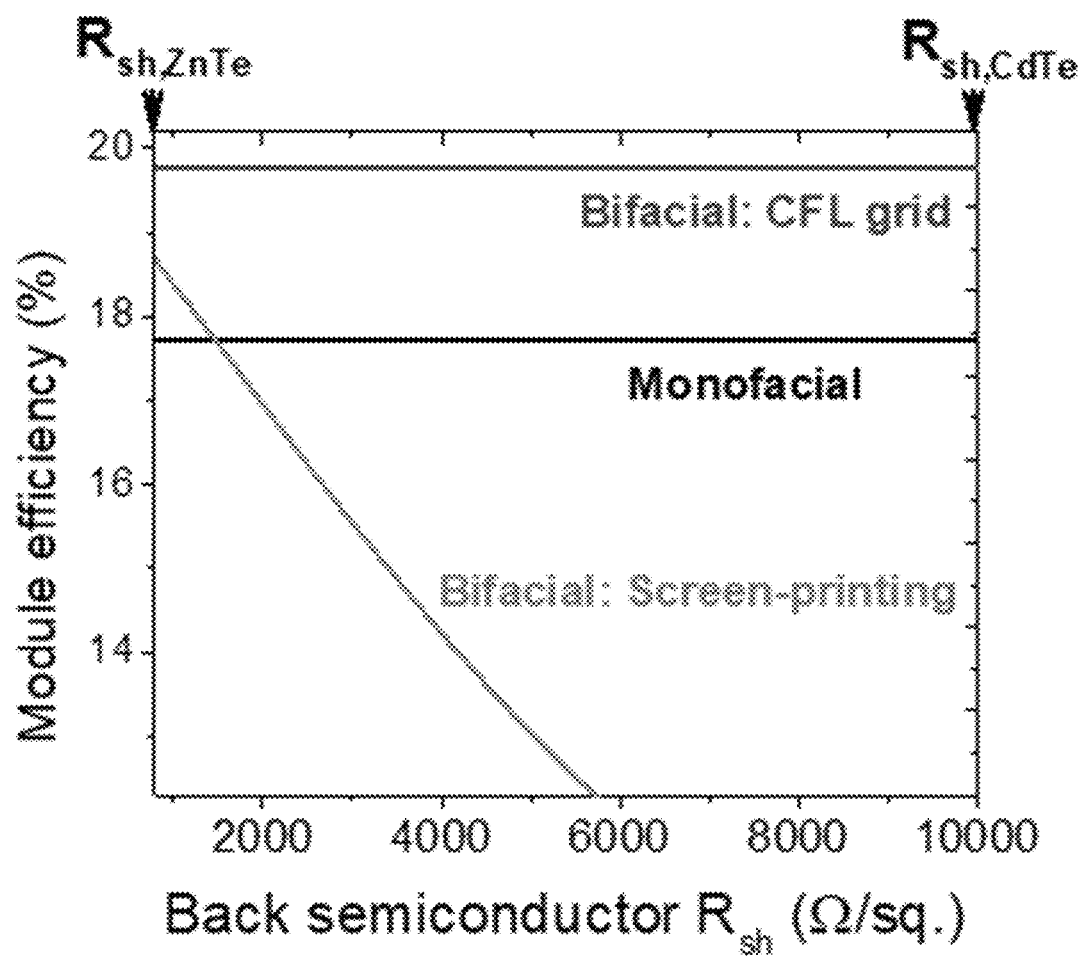
FIG. 43 depicts module efficiency calculated for baseline monofacial CdTe (black; back contact $R_{sh}$=0.5 Ω/sq.), bifacial with a screen-printed back grid (gray), and bifacial with a CFL back grid (green). Calculations use a front TCO sheet resistance of 15 Ω/sq., grid T=0.95, monolith width of 0.5 cm, and a bifacial current boost of 10% at T=0.95.

For bifacial CdTe, the use of a passivating layer at the back is desirable for enhancing the collection of photogenerated carriers near the back contact. Previous studies on bifacial CdTe have shown poor collection of rear-generated carriers (the best rear-illuminated efficiency reported is only 5.0%), so realizing the full bifacial boost will almost certainly require passivation. Typical passivating layers, such as $Al_2O_3$, are highly resistive. Therefore, the actual back semiconductor sheet resistance may need to be higher than its current industry-standard value (about 780 Ω/sq.) to enable a worthwhile bifacial boost. Module efficiency is shown as a function of back semiconductor sheet resistance in FIG. 43, ranging from that of doped ZnTe (780 Ω/sq.) to that of CdTe (10,000 Ω/sq.). As shown, CFL grids outperform screen-printing because of their much narrower wire spacing at grid T=0.95.

Figures 44A, 44B, 44C, 44D:
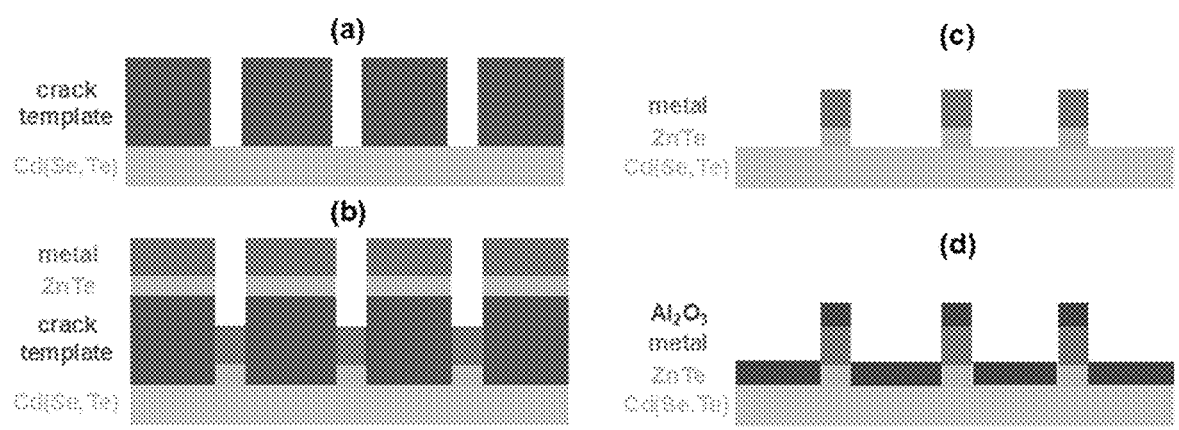
FIGS. 44a, 44b, 44c, and 44d are schematics depicting the crack template deposition (FIG. 44a), patterned ZnTe and metal deposition (FIG. 44b), lift-off (FIG. 44c), and $Al_2O_3$ (FIG. 44d) passivator deposition.
Figures 45A, 45B:
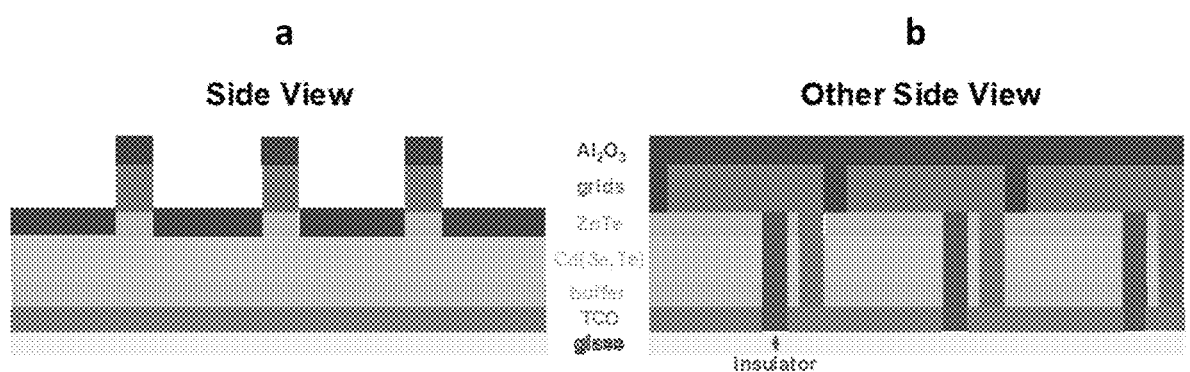
FIG. 45 is a schematic depicting a desirable architecture that passivates most of the CdTe surface (FIG. 45a), while readily integrating into monolith processes (FIG. 45b).
Figures 46A, 46B, 46C, 46D:
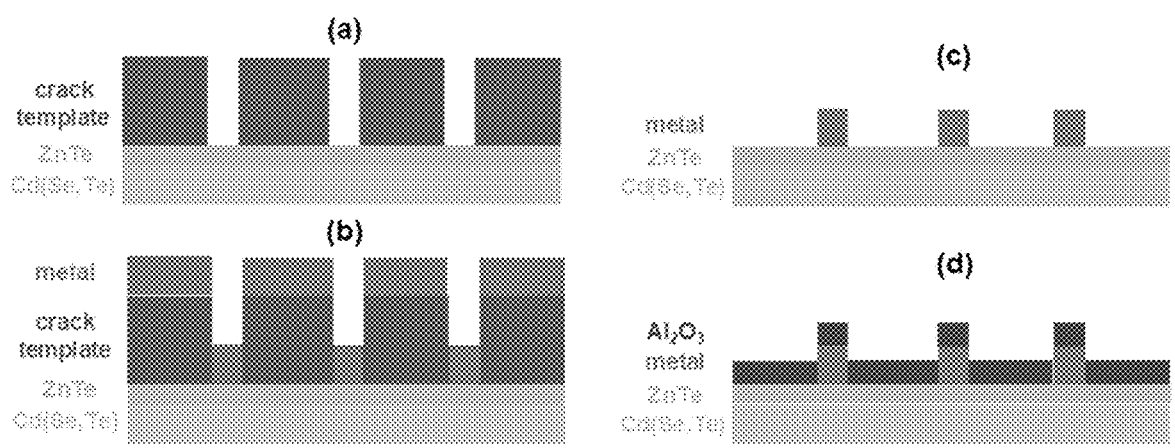
FIGS. 46a, 46b, 46c, and 46d are schematics depicting an architecture that passivates most of the CdTe surface (FIGS. 46a, 46b), while readily integrating into monolith processes (FIGS. 46c, 46d).
Figures 47A, 47B, 47C, 47D:
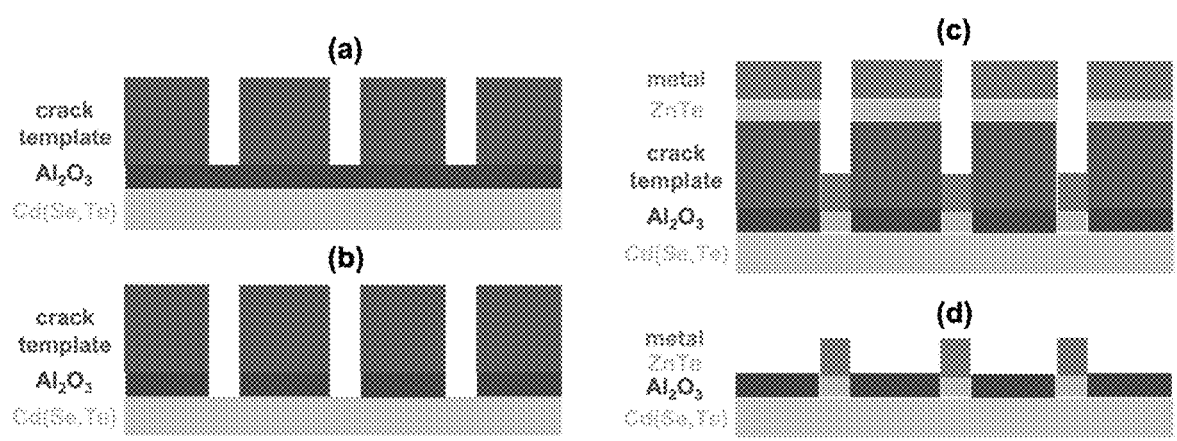
FIGS. 47a, 47b, 47c, and 47d are schematics depicting how a high temperature treatment (e.g., a 200–500° C. anneal in $CdCl_2$ vapor) can be applied to the Cd(Se,Te)/$Al_2O_3$ before crack template deposition (FIG. 47a), followed by $Al_2O_3$ passivator removal by etching (FIG. 47b), ZnTe contacting layer/metal deposition (FIG. 47c), and lift-off (FIG. 47d).

A method for implementing passivation is to pattern the contact layer (e.g., doped ZnTe) as well as the passivating layer (e.g., $Al_2O_3$) in addition to the metal grids. Since ZnTe may require thermal activation at 200-300° C., an inorganic crack template can be used that can withstand those temperatures (FIG. 44). FIG. 45 shows how this scheme can be implemented with monolithic integration. If lower sheet resistance of the contacted semiconductor is needed, the doped ZnTe contact layer can be deposited before the crack template (FIG. 46). It may be desirable to passivate Cd(Se,Te) by depositing a film such as $Al_2O_3$, followed by annealing at high temperature (e.g., a 200-500° C. anneal in $CdCl_2$ vapor). FIG. 47 depicts how, after such a high temperature treatment, a crack template can be deposited that serves as a mask for subsequent $Al_2O_3$ removal by etching. Then, the ZnTe contacting layer and metal grid are deposited onto the freshly exposed Cd(Se,Te), and lift-off is performed.

Process simplicity: the doped ZnTe-coated stacks can be coated with a crack template, followed by sputtering of the Al and lift-off. This process results in only two added steps, both of which can be performed in seconds.

Compatibility with Si. Proof-of-concept solar cells were fabricated with CFL to demonstrate its compatibility with monocrystalline-Si, a photovoltaic absorber that is highly susceptible to contamination. The cells used passivated contacts on both sides of as-sawn n-type (phosphorus-doped) Czochralski wafers. Previously reported fabrication methods were used. In brief, about 1.5 nm thick SiOx passivating layers were contacted with about 50 nm thick degenerately-doped and H-doped amorphous-Si layers on both sides of the wafer. The amorphous-Si layers were then crystallized into polycrystalline-Si layers by thermal annealing. Hydrogen-induced passivation was applied by $Al_2O_3$ atomic layer deposition and annealing. The back contact was a 2.4×1.5 cm² blanket of 40 nm Ti/1 μm Ag deposited by thermal evaporation at 0.5 nm/s or less after etching the back side's $Al_2O_3$ in 1% HF for about 1 min. For the front grids, the front $Al_2O_3$ was similarly etched in HF, followed by immediate coating with the crack template: An 11.7% wt./vol. suspension of $TiO_2$ ("aeroxide" or "P25"; 21 nm particle diameter) in ethanol with 10% vol./vol. dimethylsulfoxide surfactant was sonicated 20 min, followed by drop-casting (62.5 μL/cm²). After drying for several minutes, a shadow mask was added to confine metal to the device area, and 40 nm Ti/6 μm Ag was thermally evaporated at 0.5 nm/s or less. Lift-off was performed by immersion in ethanol and ultrasonication for 60 s. For the patterned CFL demonstration, a 30% wt./vol. PMMA solution was made by diluting with 85% vol./vol. isopropanol/water 10 (to improve wetting), and spin-coated at 3000 rpm. 40 nm Ti/2.5 μm Ag was then evaporated through a tapered finger mask. Si JV measurements were performed by illuminating 1 sun through a 3.6 cm² aperture mask. The PV performance summarized in Table 5 demonstrates that CFL grids had similar open-circuit voltage and fill factor to the optimized baseline grids. Thus, performing CFL with $TiO_2$ and PMMA crack template materials did not degrade the samples by inducing stress in the wafer, polycrystalline-Si layers, or passivating SiOx layers, or by introducing contaminants during template deposition or lift-off.

TABLE 5

Summary of PV parameters for the passivated contact Si solar cells.

| Sample | Eff. (%) | $V_{OC}$ (mV) | $J_{SC}$ (mA/cm$^2$) | FF (%) |
|---|---|---|---|---|
| Baseline | 12.5 | 707 | 23.2 | 76.2 |
| TiO$_2$ template | 12.9 | 702 | 24.7 | 74.6 |
| Patterned PMMA template | 13.4 | 703 | 25.7 | 74.1 |

The fundamentals of using CFL to pattern metal grids for transparent conduction in solar cells were explored. Crack spacing was well-correlated with capillary pressure after proper scaling. Changing the crack template thickness is the primary means of controlling the three-way tradeoff important for PV applications: Thinner templates had lower crack footprints, narrower cracks and narrower crack spacings, leading to higher metal grid transmittance, higher grid sheet resistance and lower resistance induced in the contacted semiconductor. Successful lift-off required that the metal thickness be less than ⅓ of the crack template thickness, further constraining grid sheet resistance. Grid and semiconductor resistances were calculated for solar cell applications, and the CFL-patterned grids fabricated in this work were predicted to reduce power loss, relative to screen-printed grids, for narrow solar cells (0.5-2 cm wide) and resistive semiconductors (≥100 Ω/sq.)—making them well-suited to monolithically-integrated thin-film PV modules.

CFL can be used to grow grids directly on solar cells, can be vacuum- and Ag-free, and has better durability than nanowires. In spite of CFL's promise for next-generation transparent conduction applications, previous solar cell demonstrations have had lackluster performance. The present study has outlined a method for breaking through CFL's fundamental T/R$_{sh}$,grid/wire spacing tradeoff: By introducing macroscopic nonuniformities, more favorable JSC/FF tradeoffs can be engineered for specific applications. Moreover, the addition of tapered finger patterns to CFL grids in this work shifted the optimal CFL process away from lift-off failure, to more reproducible and uniform conditions. This technique was used to match baseline grid performance in small area CIGS cells, culminating in a 19.3%-efficient device. Simulations demonstrated that the patterning of CFL grids achieved a better balance of shadowing, grid resistance and TCO resistance losses, similar to the optimal baseline grids. Calculations further showed that adding grids to monolithically-integrated modules improves efficiency by reducing TCO current and resistance losses at wider monoliths. The patterned CFL grids fabricated in this work were predicted to obtain a 0.7% absolute efficiency boost over screen-printed grids for CIGS modules.

The foregoing disclosure has been set forth merely to illustrate the invention and is not intended to be limiting.

We claim:

1. A method for using cracked film lithography to make a metal grid, comprising:
    coating a substrate with a nanoparticle solution comprising a solvent and nanoparticles and evaporating the solvent, wherein the solvent evaporation creates a crack template for metal deposition;
    depositing a metal onto the crack template at a thickness that is less than or equal to 0.40 of the thickness of the crack template; and
    lifting off the crack template to create the metal grid, wherein:
    the crack template comprises poly(methyl methacrylate) or polystyrene, and
    the metal grid does not delaminate from the substrate during the lifting off.

2. The method of claim 1 wherein the metal grid comprises transparent contacts.

3. The method of claim 2 wherein the transparent contacts are part of a photovoltaic cell.

4. The method of claim 3 wherein the photovoltaic cell is a solar cell.

5. The method of claim 4 wherein the solar cell is at least 19.3% efficient.

6. The method of claim 4, wherein the efficiency of the solar cell has at least a 0.7% absolute efficiency boost when compared to the same solar cell made using a screen-printed grid instead of cracked film lithography.

7. The method of claim 1, wherein the method does not comprise the use of Ag.

8. The method of claim 4, wherein the photovoltaic cell has a width of from about 0.5 to about 2 cm and has a semiconductor sheet resistance of greater than 100 Ω/sq.

* * * * *